US009003242B2

(12) United States Patent
Tokiwa

(10) Patent No.: US 9,003,242 B2
(45) Date of Patent: Apr. 7, 2015

(54) SEMICONDUCTOR MEMORY DEVICE AND METHOD OF CONTROLLING THE SAME

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 194 days.

(21) Appl. No.: 13/428,089

(22) Filed: Mar. 23, 2012

(65) Prior Publication Data
US 2012/0303871 A1 Nov. 29, 2012

(30) Foreign Application Priority Data

May 26, 2011 (JP) ................................. 2011-117806

(51) Int. Cl.
G06F 11/00 (2006.01)
G11C 29/44 (2006.01)
G11C 13/00 (2006.01)

(52) U.S. Cl.
CPC ........ *G11C 29/44* (2013.01); *G11C 2029/4402* (2013.01); *G11C 13/0004* (2013.01); *G11C 13/0007* (2013.01)

(58) Field of Classification Search
USPC .......................................... 714/54, 42, 6.1, 25
See application file for complete search history.

(56) References Cited

U.S. PATENT DOCUMENTS

| 7,606,059 | B2 | 10/2009 | Toda |
| 7,952,958 | B2 | 5/2011 | Yanagidaira et al. |
| 7,989,789 | B2 | 8/2011 | Toda |
| 8,004,873 | B2 | 8/2011 | Toda |
| 2004/0083407 | A1* | 4/2004 | Song et al. ........................ 714/27 |
| 2009/0089613 | A1* | 4/2009 | Koike .............................. 714/12 |
| 2010/0238706 | A1 | 9/2010 | Tokiwa et al. |
| 2011/0044092 | A1* | 2/2011 | Ono et al. ........................ 365/148 |

FOREIGN PATENT DOCUMENTS

| JP | 2005/522045 | 7/2005 |
| JP | 2006-514393 | 4/2006 |
| JP | 2009-199695 | 9/2009 |
| WO | WO 03/085675 A2 | 10/2003 |
| WO | WO 2004/084229 A1 | 9/2004 |

OTHER PUBLICATIONS

Office Action issued May 7, 2014 in Japanese Patent Application No. 2011-117806 (with English translation).

* cited by examiner

*Primary Examiner* — Sarai Butler

(74) *Attorney, Agent, or Firm* — Oblon, McClelland, Maier & Neustadt, L.L.P.

(57) ABSTRACT

According to one embodiment, a semiconductor memory device includes a memory cell array including a plurality of memory cells, a first register configured to store data of the memory cells, and a sequence control circuit configured to control the memory cell array and the first register. In at least a data read operation of the memory cells, the sequence control circuit reads out, from the memory cell array, data including flag information representing whether the number of failed bits is in an allowable range.

17 Claims, 20 Drawing Sheets

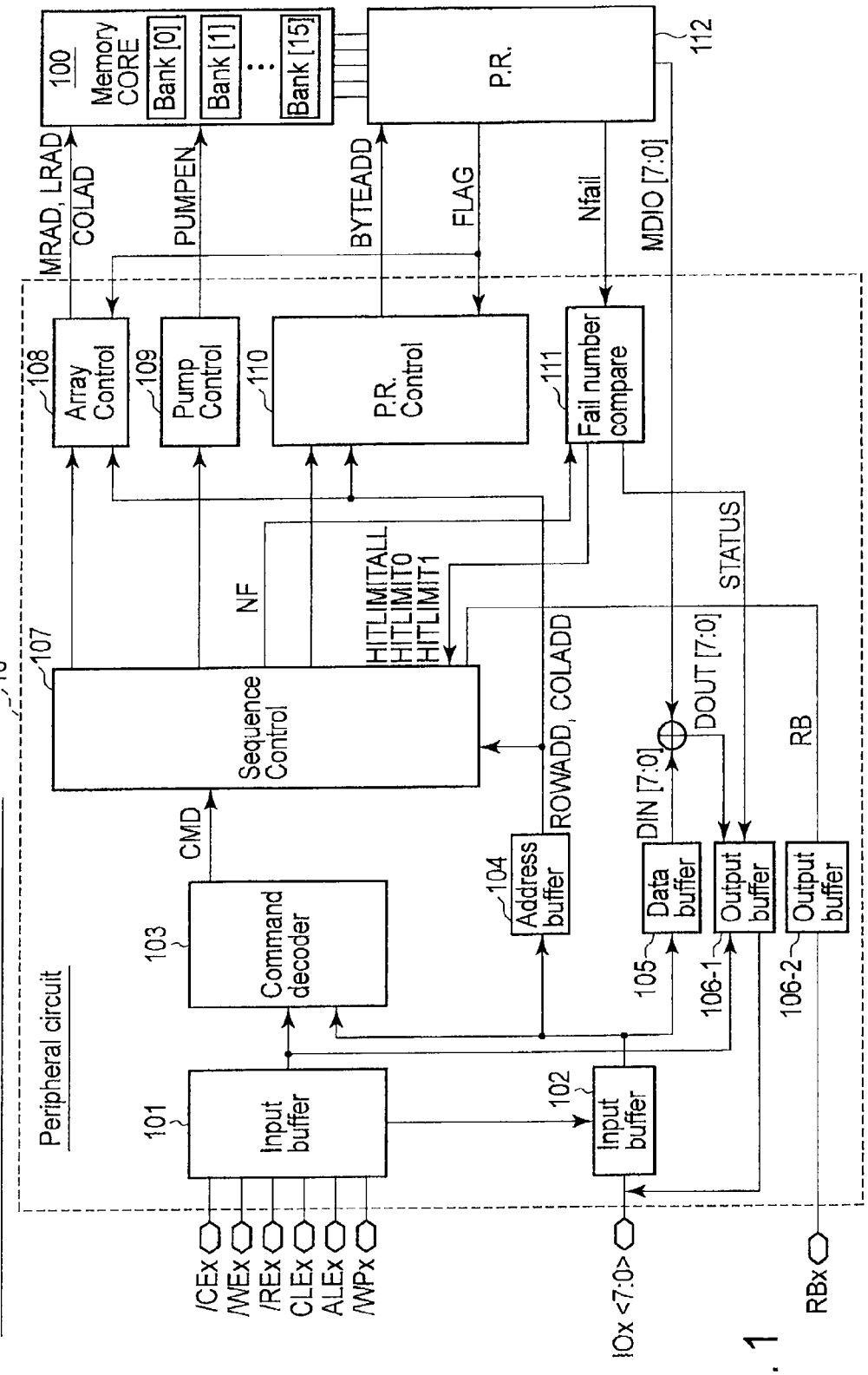
F I G. 1

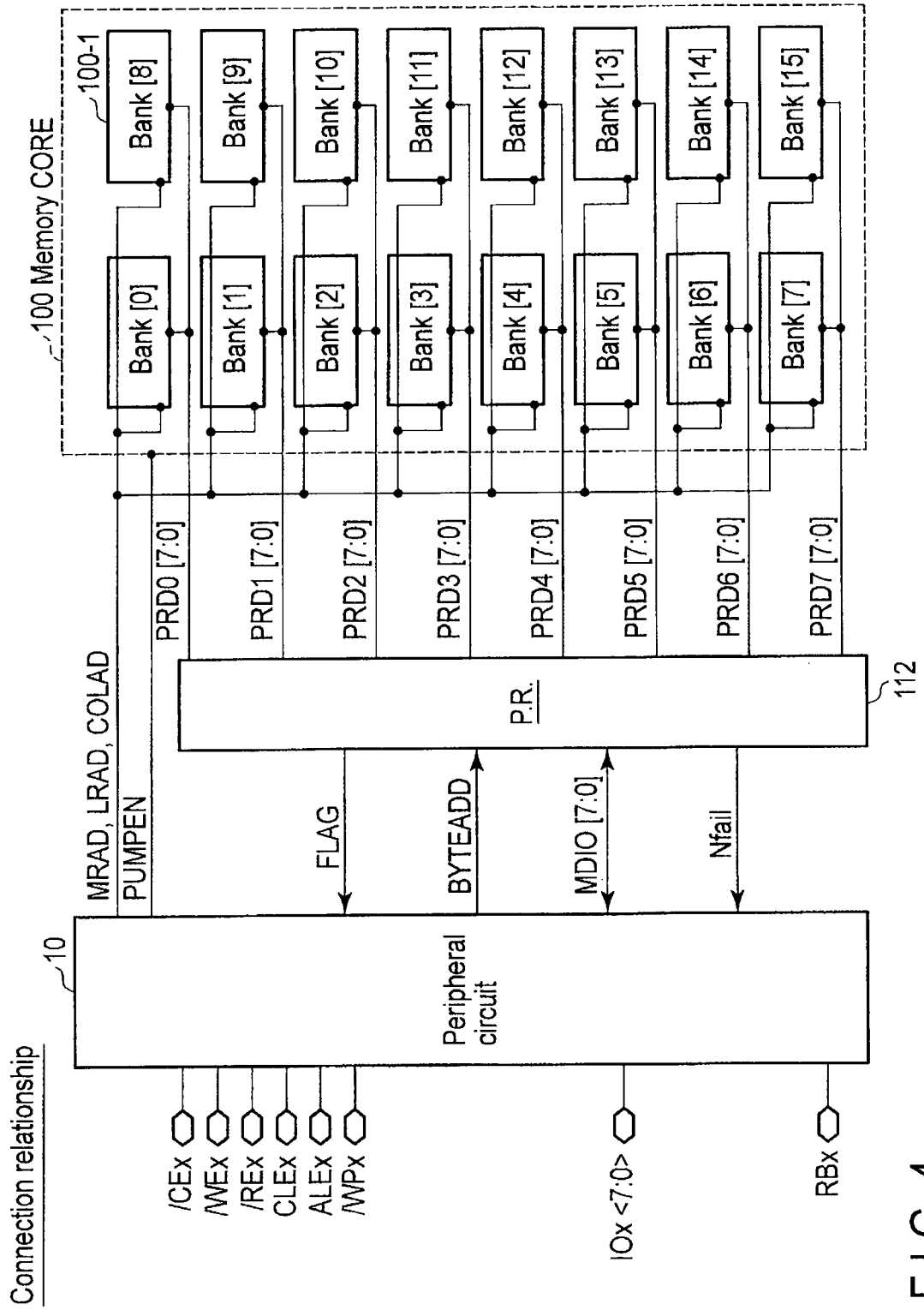
F I G. 4

Example of arrangement in Bank

Row Subdec 201

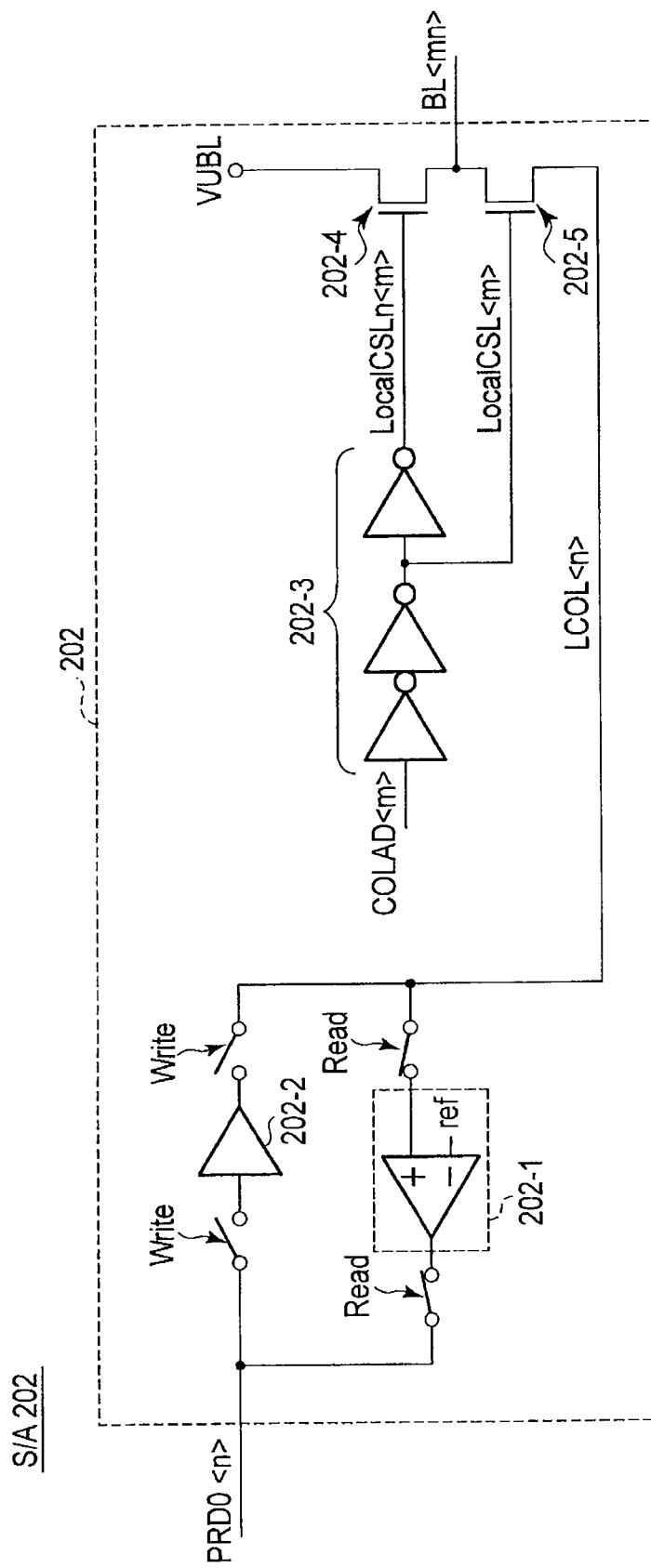
F I G. 7

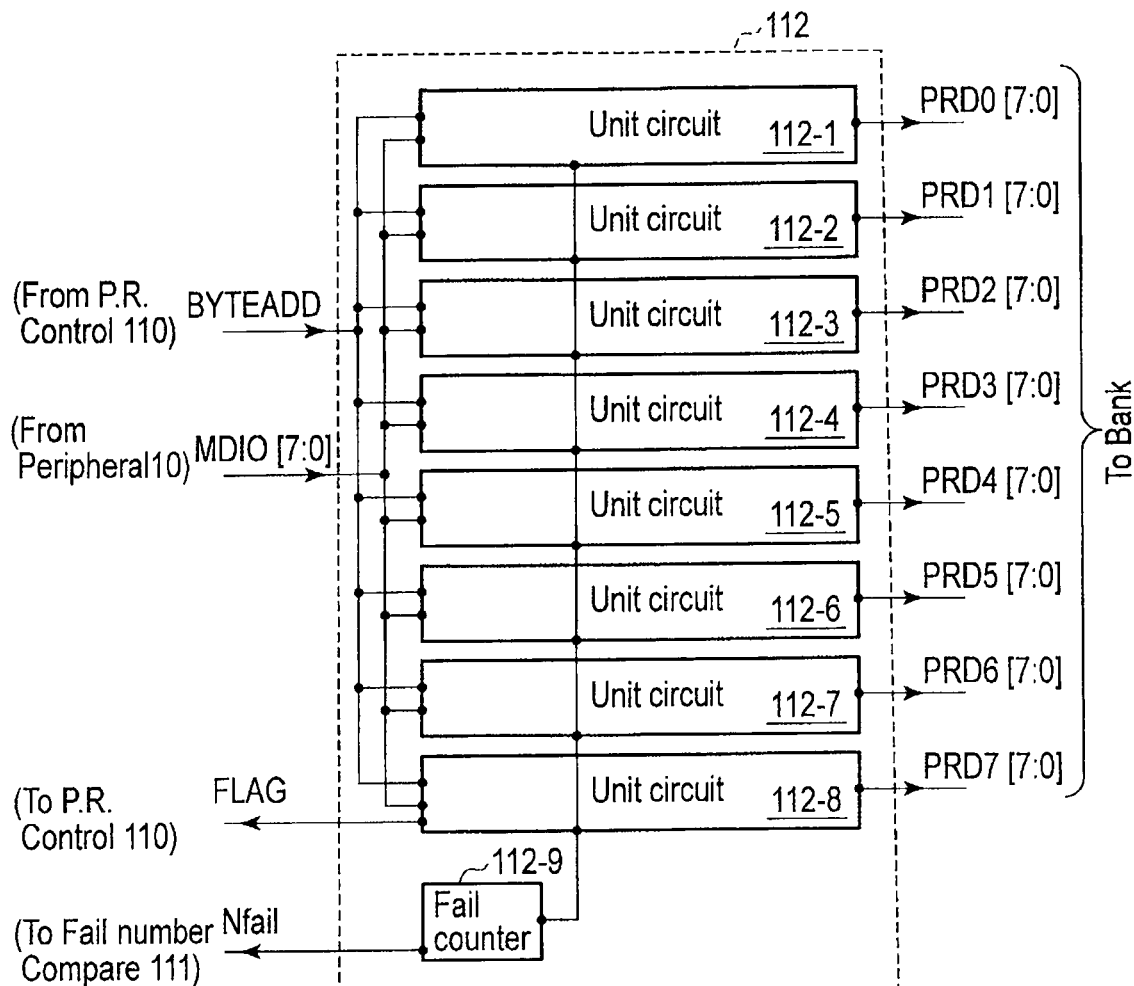
F I G. 8

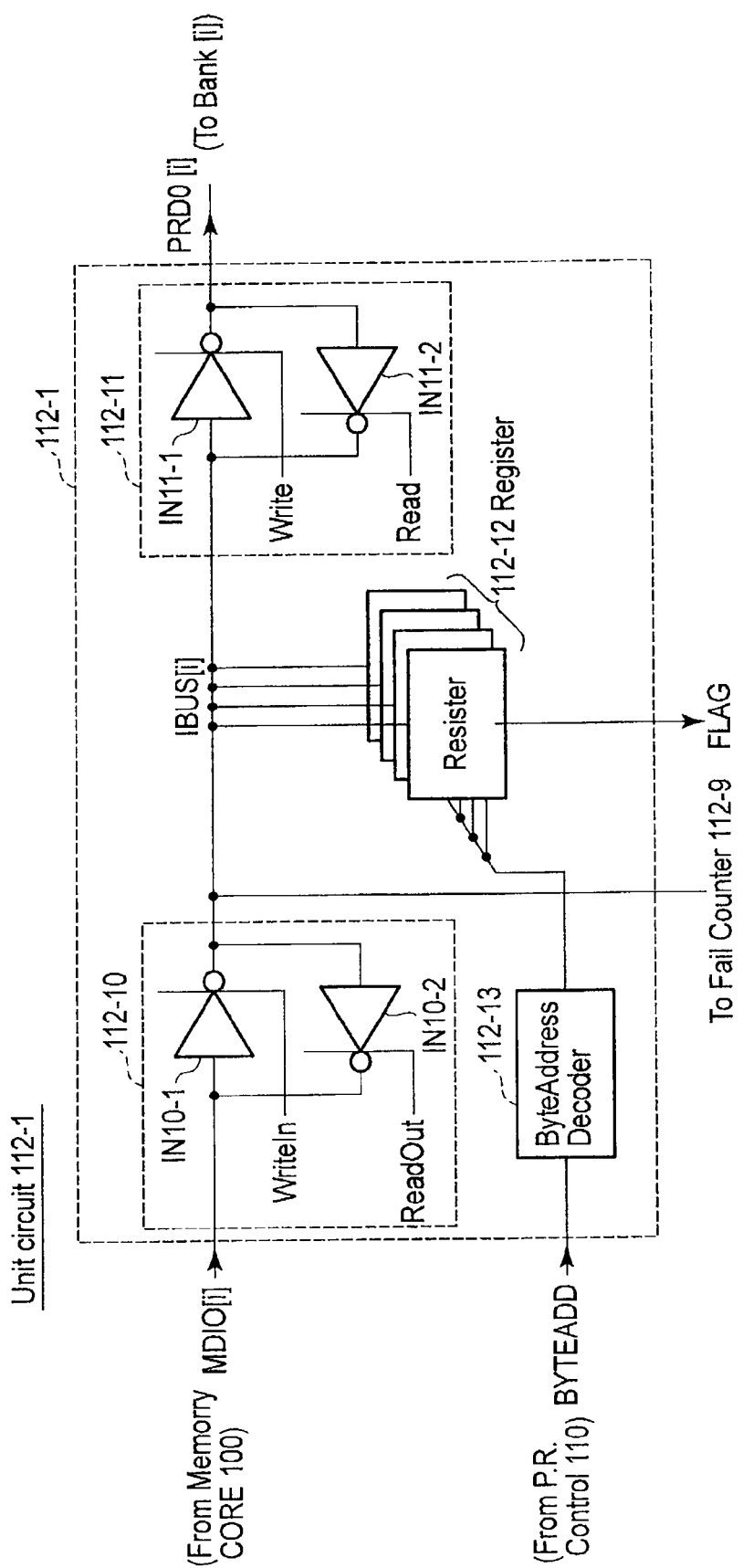
F I G. 9

Decoding table

| BYTEADD | First address mapping | Second address mapping |
|---|---|---|
| 0 | Read from (or stored in) Bank0 | Read from (or stored in) Bank0 |
| 1 | Read from (or stored in) Bank1 | Read from (or stored in) Bank0 |
| 2 | Read from (or stored in) Bank2 | Read from (or stored in) Bank0 |
| 3 | Read from (or stored in) Bank3 | Read from (or stored in) Bank0 |
| 4 | Read from (or stored in) Bank4 | Read from (or stored in) Bank1 |
| 5 | Read from (or stored in) Bank5 | Read from (or stored in) Bank1 |
| 6 | Read from (or stored in) Bank6 | Read from (or stored in) Bank1 |
| 7 | Read from (or stored in) Bank7 | Read from (or stored in) Bank1 |
| 8 | Read from (or stored in) Bank0 | Read from (or stored in) Bank2 |
| 9 | Read from (or stored in) Bank1 | Read from (or stored in) Bank2 |
| 10 | Read from (or stored in) Bank2 | Read from (or stored in) Bank2 |
| 11 | Read from (or stored in) Bank3 | Read from (or stored in) Bank2 |
| ⋮ | | |
| 27 | Read from (or stored in) Bank3 | Read from (or stored in) Bank7 |
| 28 | Read from (or stored in) Bank4 | Read from (or stored in) Bank7 |
| 29 | Read from (or stored in) Bank5 | Read from (or stored in) Bank7 |
| 30 | Read from (or stored in) Bank6 | Read from (or stored in) Bank7 |
| 31 | Read from (or stored in) Bank7 | Read from (or stored in) Bank7 |
| 32 | Read from (or stored in) Bank7 | Read from (or stored in) Bank7 |

FIG. 11

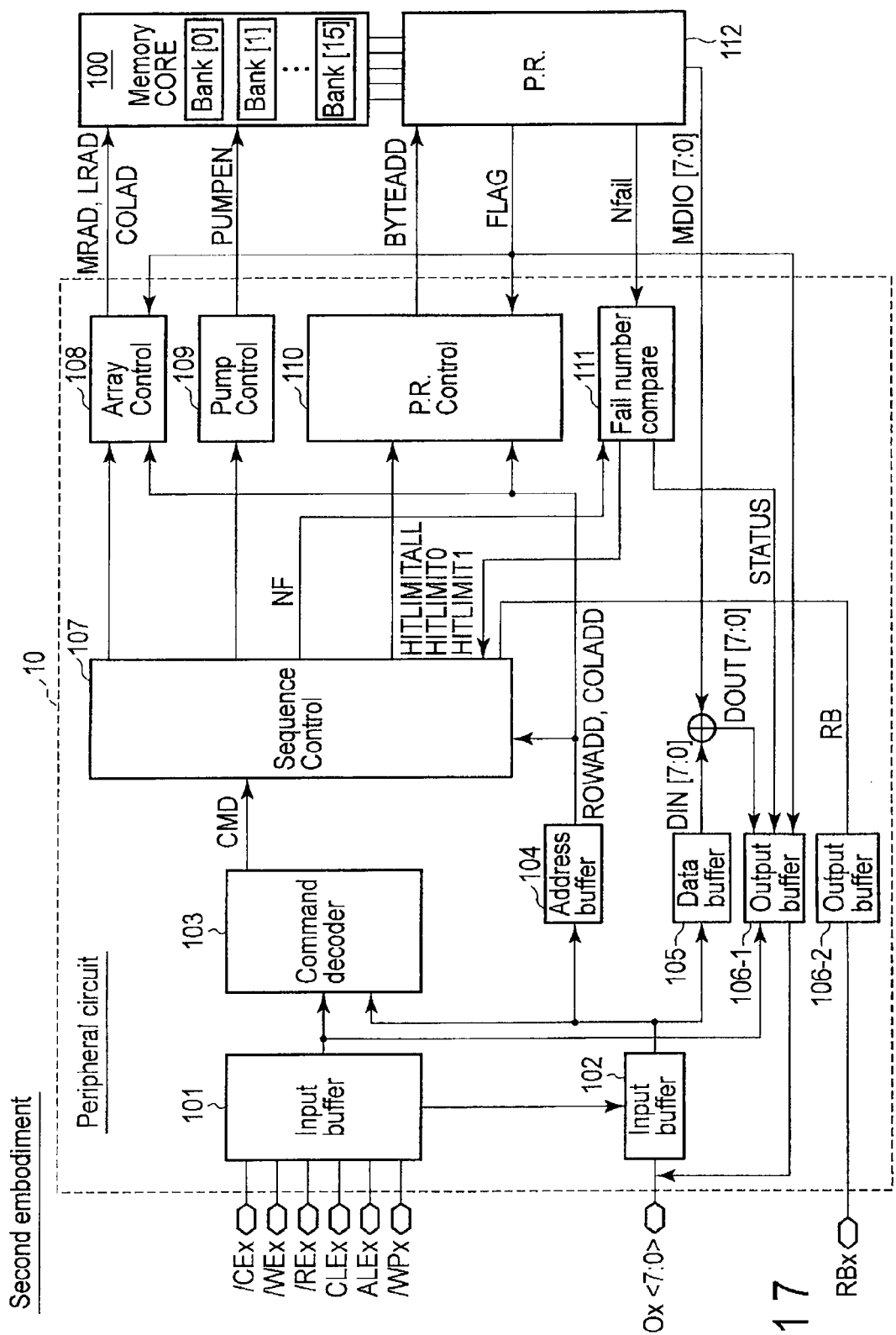
F I G. 17

Flag information (second embodiment)

0: Fail-flag in first area
1: Fail-flag in second area
2: Fail-flag in third area
3: Fail-flag in fourth area
4: Fail-flag in fifth area
5: Fail-flag in sixth area
6: Fail-flag in seventh area
7: Fail-flag in eighth area

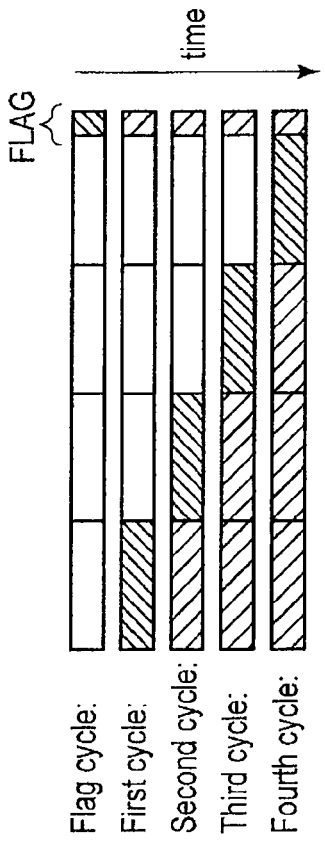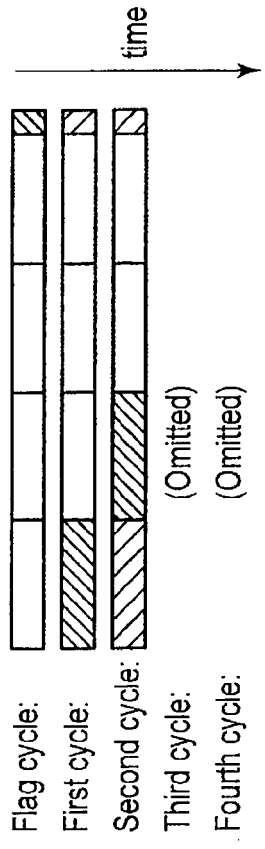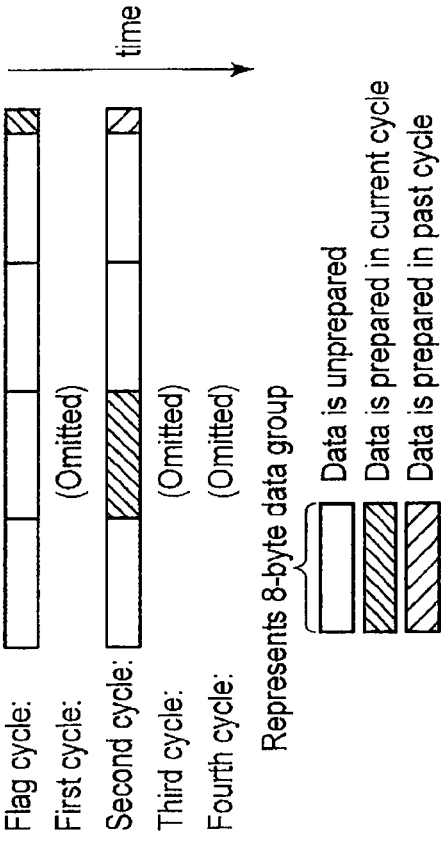

SEMICONDUCTOR MEMORY DEVICE AND METHOD OF CONTROLLING THE SAME

CROSS-REFERENCE TO RELATED APPLICATIONS

This application is based upon and claims the benefit of priority from prior Japanese Patent Application No. 2011-117806, filed May 26, 2011, the entire contents of which are incorporated herein by reference.

FIELD

Embodiments described herein relate generally to a semiconductor memory device and a method of controlling the same.

BACKGROUND

To increase the capacity of a nonvolatile semiconductor memory device, an arrangement for storing data based on a resistance change in three-dimensionally stacked elements has been proposed.

This arrangement is represented by, for example, a PCRAM (Phase Change Random Access Memory) using a chalcogenide element as a variable resistive element and a ReRAM (Resistance Random Access Memory) using a transition metal oxide.

BRIEF DESCRIPTION OF THE DRAWINGS

FIG. 1 is a block diagram showing an example of the overall arrangement of a semiconductor memory device according to the first embodiment;

FIG. 4 is a block diagram showing the connection relationship to a memory CORE shown in FIG. 1;

FIG. 7 is an equivalent circuit diagram showing an example of the arrangement of a sense amplifier circuit shown in FIG. 5;

FIG. 8 is a block diagram showing an example of the arrangement of a page register circuit shown in FIG. 1;

FIG. 9 is an equivalent circuit diagram showing an example of the arrangement of a unit circuit shown in FIG. 8;

FIG. 11 is a view showing a decoding table according to the first embodiment;

FIG. 17 is a block diagram showing an example of the overall arrangement of a semiconductor memory device according to the second embodiment;

FIGS. 20A, 20B, and 20C are views for explaining a data read cycle according to the third embodiment.

DETAILED DESCRIPTION

Figure 2:
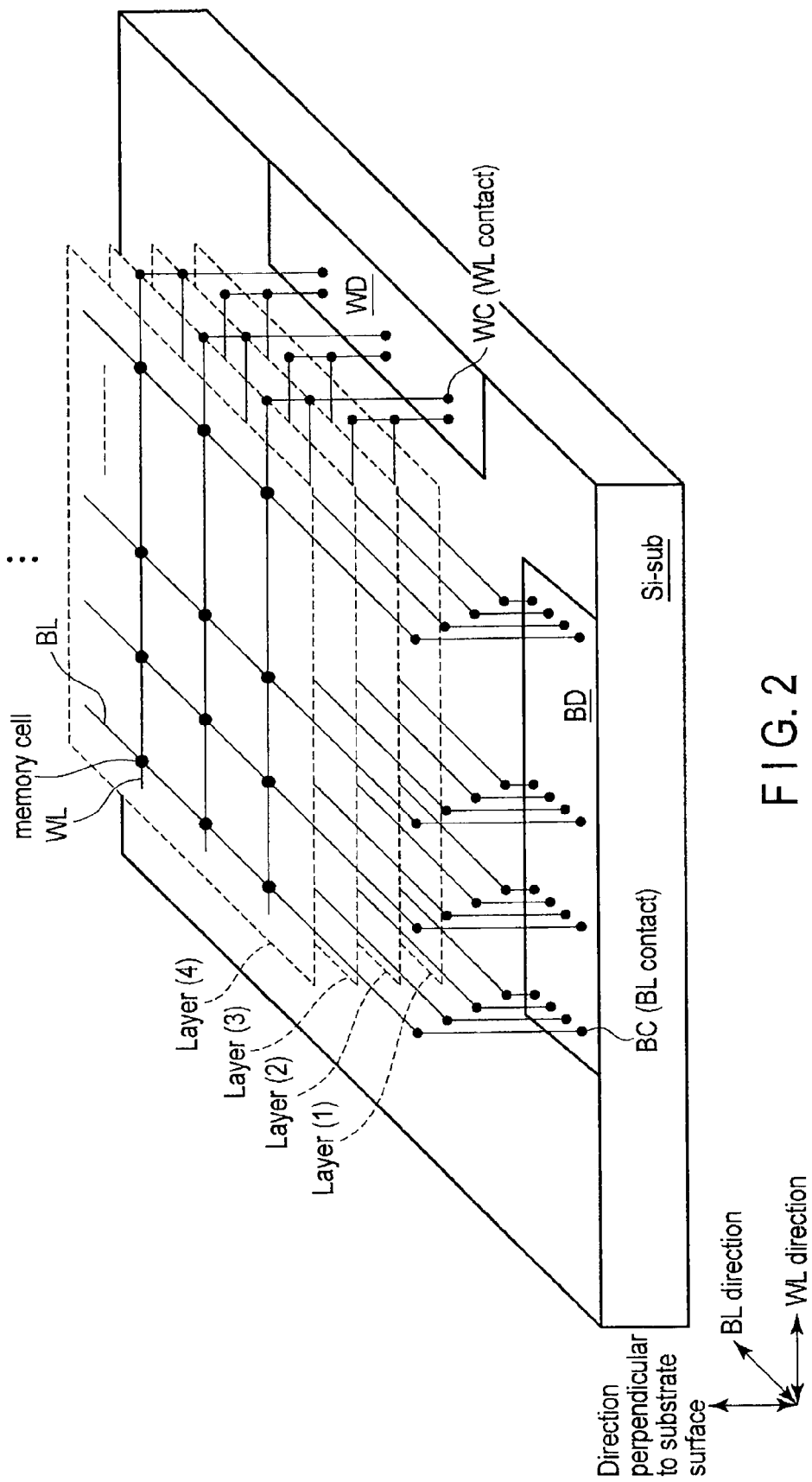
FIG. 2 is a perspective view showing an example of the arrangement of one bank shown in FIG. 1.

In general, according to one embodiment, a semiconductor memory device includes a memory cell array including a plurality of memory cells, a first register configured to store data of the memory cells; and a sequence control circuit configured to control the memory cell array and the first register, wherein in at least a data read operation of the memory cells, the sequence control circuit reads out, from the memory cell array, data including flag information representing whether the number of failed bits is in an allowable range, determines a state of the readout flag information, and upon determining that the flag information exists, reads out the data of the memory cell using second address mapping whose read order is different from that of first address mapping for mapping the data to read out the data in an order of addresses stored in the first register.

In a cross-point nonvolatile semiconductor memory device such as a ReRAM which stores data using a diode and a variable resistive element, a read error and the like tend to occur due to a decrease in yield and a decrease in convenience caused by failed data generated during the manufacturing process, and performance degradation caused by an unnecessary operation and the like.

The embodiments will now be described with reference to the accompanying drawings. Note that in the following explanation, the same reference numerals denote the same parts throughout the drawings.

First Embodiment

A semiconductor memory device according to the first embodiment and a data control method thereof will be described with reference to FIGS. 1, 2, 3, 4, 5, 6, 7, 8, 9, 10A, 10B, 11, 12, 13, 14, 15, and 16.

<1. Example of Arrangement>
1-1. Example of Overall Arrangement

An example of the overall arrangement of the semiconductor memory device according to the first embodiment will be described first with reference to FIG. 1.

As shown in FIG. 1, the semiconductor memory device according to this embodiment comprises a memory CORE 100, a page register (P.R.) 112, and a peripheral circuit 10.

The memory CORE 100 includes a plurality of banks Bank[0], Bank[1], ..., Bank[15] in which a plurality of memory cells are three-dimensionally arranged at the intersections between word lines and bit lines. Note that the memory CORE 100 is not limited to this and may comprise a plurality of planes formed by logically dividing the memory CORE into at least two parts, and the bank arrangement or the plane arrangement is not limited to those of the embodiment. Details will be described later.

The P.R. 112 receives a signal BYTEADD for mainly designating a column address from a page register control circuit (P.R. control) 110, and outputs a flag signal FLAG to the P.R. control 110. Details will be described later.

The peripheral circuit 10 receives, from a memory controller (not shown), control signals such as a chip enable signal /CEx, a write enable signal /WEx, a read enable signal /REx, a command latch enable signal CLEx, an address latch enable signal ALEx, a write protect signal /WPx, and receives data from the semiconductor memory device through an input/output bus IOx<7:0>. The peripheral circuit 10 controls a ready/busy signal RBx to inform its status to a memory controller (not shown).

An input buffer 101 receives the control signals such as the above-described chip enable signal /CEx, write enable signal /WEx, read enable signal /REx, command latch enable signal CLEx, address latch enable signal ALEx, and write protect signal /WPx. The inputting/outputting of these command, address, and data is controlled using these received control signals.

The input/output bus IOx<7:0> is connected to an input buffer 102. The input buffer 102 transfers commands, addresses, and input data to necessary portions in the device under the control of the output of the input buffer 101. The input/output bus IOx<7:0> is also connected to an output buffer 106-1. The output buffer 106-1 externally outputs data using this path.

A command decoder 103 has authority to interpret a command and decide the start of a necessary operation such as data write, read, or erase and the internal operation state as needed. A signal to instruct the start of an internal operation is sent to a sequence control circuit (sequence control) 107 as a command signal CMD.

An address buffer 104 holds an externally input data write, erase, or read address. The address buffer 104 forms a counter circuit or incorporates an address comparison circuit as needed.

A data buffer 105 temporarily holds externally input write data or erase data. The held data is transferred to the P.R. 112 via a bus DIN[7:0], a bus arbiter, and a bus MDIO[7:0].

An output buffer 106-2 is a buffer circuit that controls the ready/busy signal RBx to notify the external memory controller whether an internal operation of the device is being performed.

The sequence control 107 is a control circuit that controls the operations of the entire device, including the data read, write, erase, and internal test operation. The sequence control 107 receives address signals (row address ROWADD and column address COLADD), a signal HITLIMIT that notifies whether the failed bit number to described later is larger than the allowable number, and the like, as needed, for sequence control, and directly controls an array control circuit (array control) 108, a charge pump control circuit (pump control) 109, the P.R. control 110, and a failed bit number comparison circuit (fail number compare) 111. A signal RB is sent to the output buffer 106-2 to notify whether the sequence control 107 is operating.

The array control 108 outputs a decoded main row address signal MRAD, local row address LRAD, and cycle address COLAD which are input to the memory CORE 100 and mainly used to access a memory cell. These signals are generated from the row address ROWADD and the column address COLADD output from the address buffer 104.

The pump control 109 includes a means for controlling a boost circuit operation at a necessary timing as needed. Note that this component is not indispensable.

The P.R. control 110 outputs the signal BYTEADD for mainly designating a column address.

The fail number compare 111 includes a means for counting the number of failed bits existing in a specific area and comparing the number with an allowable failed bit number, and notifies the sequence control 107 of the comparison result via the signal line HITLIMIT especially at the time of write, erase verify, or test. The count result is simultaneously sent to the output buffer 106-1 by a signal STATUS so as to be externally output from the device.

1-2. Example of Arrangement of Bank

An example of the bank will be described next with reference to FIG. 2. Bank[0] will be exemplified here.

As shown in FIG. 2, Bank[0] comprises a plurality of layers (Layer(1) to Layer(4)) arranged in a direction perpendicular to the substrate surface of a semiconductor substrate (Si-sub), and a bit line driver BD and the like which are arranged in the surface region of the Si-sub under the layers.

The plurality of layers (Layer(1) to Layer(4)) comprise a plurality of memory cells arranged in a matrix at the intersections between word lines WL serving as row select lines and bit lines BL serving as column select lines. One end of each bit line BL is electrically connected to the sense amplifier circuit BD via a bit line contact BC on the Si-sub. One end of each word line WL is electrically connected to a local row decoder WD via a word line contact WC on the Si-sub.

Various kinds of logic circuits and the like including the P.R. 112 for temporarily holding write data may be arranged in the surface region of the Si-sub under the layers (Layer(1) to Layer(4)). The remaining banks substantially have the same arrangement as that of Bank[0].

Note that a defective memory may be generated due to a failure that accidentally occurs during the manufacturing process or a failure caused by a decrease in the long-term reliability during use of the device, although not particularly illustrated here. This may lead to a trouble in data read from whole memory cells of an entire bank. Details will be described later.

1-3. Example of Arrangement of Layer

An example of the arrangement of each layer will be described next with reference to FIG. 3. Layer(1) will be exemplified here.

Figure 3:
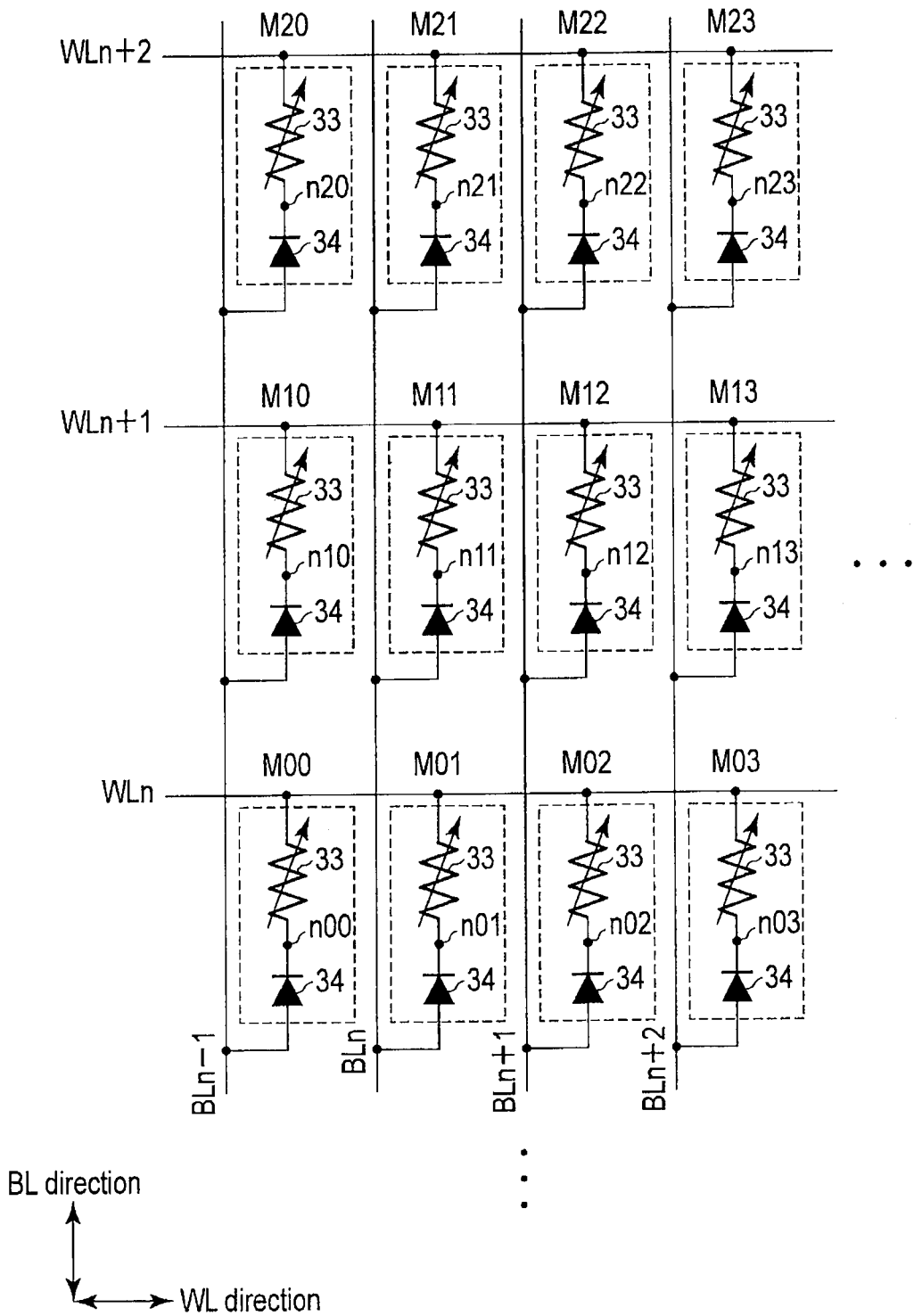
FIG. 3 is an equivalent circuit diagram showing an example of the arrangement of a layer shown in FIG. 2.

As shown in FIG. 3, a plurality of memory cells M00 to M23 are arranged in Layer 1 (Layer(1)). A total of 12 cells on four bit lines and three word lines are illustrated as an example.

Each of the plurality of memory cells M00 to M23 according to this embodiment includes a variable resistive element 33 that nonvolatilely stores an electrically rewritable resistance value as data, and a diode 34.

One end of the current path of each variable resistive element 33 is connected to one of a plurality of word lines WLn to WLn+2, and the other end is connected to the cathode of the diode 34 via a corresponding one of nodes n00 to n23. The variable resistive element 33 contains, for example, a transition metal oxide.

The anode of the diode 34 is connected to one of a plurality of bit lines BLn−1 to BLn+2.

Note that the memory cell need not always have the form of this embodiment. For example, the connection relationship between the diode 34 and the word line and the bit line may be reversed. That is, the anode of the diode 34 may be connected to the other end of the current path of the variable resistive element 33 via the node n01, and the cathode may be connected to the bit line BLn. In addition, the connection relationship between the diode and the variable resistive element may be reversed to connect the variable resistive element between the bit line and the anode of the diode.

For example, a switch transistor may be arranged in place of the diode. That is, one end of the current path of the switch transistor is connected to the other terminal of the variable resistive element 33 via the node n01, and the other end of the current path is connected to the bit line BLn. A control signal is input to the gate to control the on state of the current path.

1-4. Connection Relationship

The connection relationship of the memory CORE 100 formed by arranging a plurality of banks, the P.R. 112, and the peripheral circuit 10 will be described next with reference to FIG. 4.

As shown in FIG. 4, a total of 16 banks Bank[0] to Bank[15] 100-1 are arranged in the memory CORE 100 in this embodiment. The number is not limited to this, as a matter of course, and an optimum number of banks may be arranged. In this embodiment, Bank[0] and Bank[8] are connected to data buses PRD0[7:0]. However, more banks may be arranged. A total of eight sets of data buses PRD0[7:0] to PRD7[7:0] are arranged. However, the form is not limited to this, and an optimum number of sets may be prepared.

1-5. Arrangement in Bank

The arrangement in a bank will be described next with reference to FIG. 5.

Figure 5:
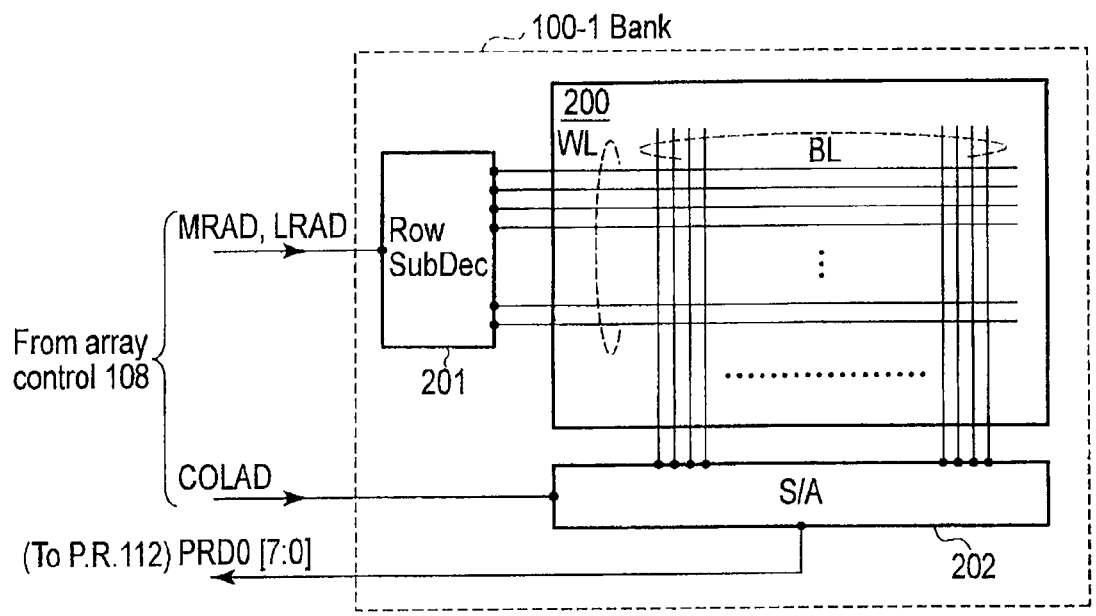
FIG. 5 is a block diagram showing the connection relationship to the memory CORE shown in FIG. 1.

As shown in FIG. 5, the bank 100-1 comprises a cell array 200, a local row decoder (Row Subdec) 201, and a sense amplifier circuit (S/A) 202 described above.

As described above, the cell array 200 comprises memory cells arranged at the intersections between the plurality of word lines WL and bit lines BL.

The Row Subdec 201 receives the signals MRAD and LRAD input from the array control 108 and applies a select potential and a nonselect potential to the necessary word lines WL.

The S/A 202 receives the signal COLAD input from the array control 108 and similarly applies a select potential and a nonselect potential to the bit lines BL. In read, write, or erase verify of the cell array 200, the S/A 202 also detects the potentials of the bit lines BL to determine the data state of each memory cell. Write/erase data and read data output from the S/A 202 are output to the P.R. 112 via the data buses PRD0[7:0].

1-6. Row Subdec

The Row Subdec 201 shown in FIG. 5 will be described next with reference to FIG. 6.

The Row Subdec 201 is a circuit configured to apply a necessary potential from one main row address MRAD<i> and one local row address LRAD<j> to one word line WL<ij>.

Figure 6:
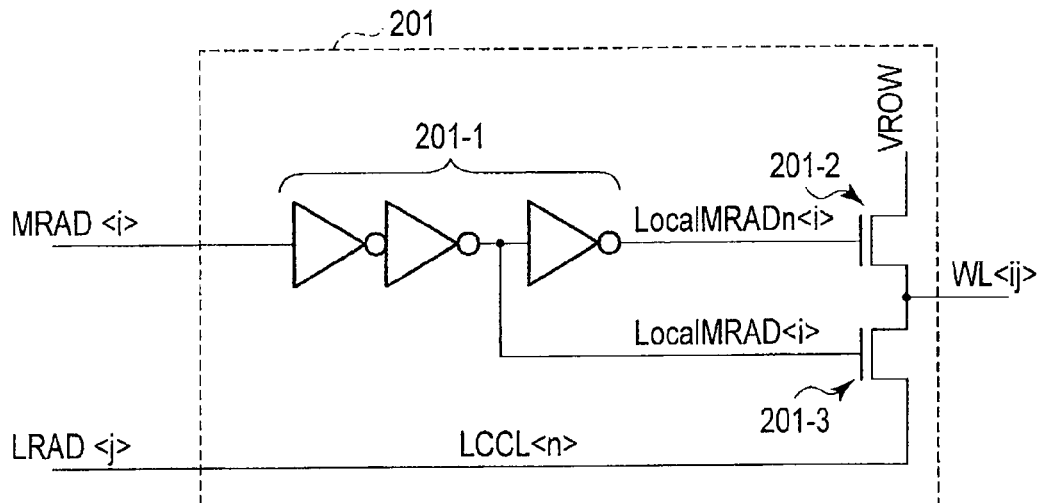
FIG. 6 is an equivalent circuit diagram showing an example of the arrangement of a local row decoder shown in FIG. 5.

As shown in FIG. 6, the Row Subdec 201 of this embodiment includes a plurality of buffer circuits 201-1, and potential transfer transistors 201-2 and 201-3.

The input to the plurality of buffer circuits 201-1 is connected to the main row address MRAD<i>, and the output is connected to the gate electrode of the potential transfer transistor 201-2.

The potential transfer transistor 201-2 has one end of its current path connected to a reference voltage VROW, and the other end of its current path connected to the word line WL<ij>.

The potential transfer transistor 201-3 has one end of its current path connected to the local row address LRAD<j>, the other end of its current path connected to the word line WL<ij>, and its gate electrode connected to the input of the first one of the plurality of buffer circuits 201-1.

In the above-described arrangement, when the word line WL<ij> is selected, LocalMRAD<i> changes to "H" level, and the potential of LRAD<j> is transferred. In an unselected state, LocalMRADn<i> changes to "H" level, and the word line WL<ij> is connected to the nonselect potential (the generation circuit and the connection relationship are not illustrated) VROW. Note that the form is not limited to this, and it is only necessary to apply a necessary potential to a predetermined word line.

1-7. S/A

The arrangement in the S/A 202 shown in FIG. 5 will be described next with reference to FIG. 7.

The S/A 202 is a circuit configured to apply a necessary potential from one cycle address COLAD<m> and one local cycle address signal LCOL<n> to one bit line BL<mn>.

As shown in FIG. 7, the S/A 202 of this embodiment includes a sense circuit 202-1, a write buffer circuit 202-2, a buffer circuit 202-3, and potential transfer transistors 202-4 and 202-5.

In read, the sense circuit 202-1 turns on the switches to compare the voltage of a memory cell with a reference voltage ref and thus detects the state of the memory cell.

In write or read, the write buffer circuit 202-2 turns on the switches to output data.

The buffer circuit 202-3 receives the cycle address COLAD<m> and applies an output LcoalCSLn<m> to the gate electrode of the potential transfer transistor 202-4.

The potential transfer transistor 202-5 has one end of its current path connected to the output LCOL<n> of the write buffer circuit 202-2, and the other end of its current path electrically connected to the bit line BL<mn>.

The potential transfer transistor 202-4 has one end of its current path connected to the bit line BL<mn>, the other end of its current path connected to a potential VUBL to be supplied to the bit line BL in an unselected state (not shown), and its gate electrode connected to the output LcoalCSLn<m> of the buffer circuit 202-3.

In the above-described arrangement, the sense circuit 202-1 and the write buffer circuit 202-2 are connected to switch circuits that are exclusively connected in data write, erase (reset), and read.

FIG. 7 illustrates the arrangement in the data read state in which the switches are connected to the sense circuit 202-1. Note that the internal arrangement of the S/A 202 is not limited to this, and it is only necessary to apply a necessary potential to a predetermined bit line.

1-8. P.R.

The P.R. 112 according to this embodiment will be described next with reference to FIG. 8.

As shown in FIG. 8, the P.R. 112 of this embodiment comprises eight unit circuits 112-1 to 112-8 and a failed bit counter 112-9.

The inputs of the unit circuits 112-1 to 112-8 are connected to the byte address BYTEADD input from the P.R. control 110 and the buses MDIO[7:0] input from the peripheral circuit 10. The data buses PRD0[7:0] to PRD7[7:0] of the outputs of the unit circuits 112-1 to 112-8 are connected to each bank. A specific unit (the unit circuit 112-8 in this embodiment) outputs the signal FLAG to the P.R. control 110.

The failed bit counter 112-9 receives data outputs from the unit circuit 112-1 to 112-8 and counts and accumulates the number of verify failed bits. At the time of test, the failed bit counter 112-9 calculates the number of memory cells in a specific data state. An output Nfail of the failed bit counter 112-9 sends the counting result to the fail number compare 111.

1-9. Unit Circuit

The arrangement of the unit circuit will be described next with reference to FIG. 9. The unit circuit 112-1 will be exemplified here.

As shown in FIG. 9, the unit circuit 112-1 is connected to the buses MDIO[i] and PRD0[i] (i is the bus number) via switch circuits (SW circuits) 112-10 and 112-11. A plurality of registers 112-12 are connected between the switch circuits 112-10 and 112-11. In addition, a byte address decoder circuit (byte address decoder) 112-13 for selecting the registers 112-12 is connected.

The SW circuit 112-10 includes inverters IN10-1 and IN10-2 that are latch-circuited so as to connect the inputs and outputs to each other. A signal WriteIn is applied to the control terminal of the inverter IN10-1. A signal ReadOut is applied to the control terminal of the inverter IN10-2.

The SW circuit 112-11 includes inverters IN11-1 and IN11-2 that have their inputs and outputs connected to each other to form a latch circuit. A signal Write is applied to the control terminal of the inverter IN11-1. A signal Read is applied to the control terminal of the inverter IN11-2. The output of the SW circuit 112-10 is connected to the failed bit counter 112-9.

The registers 112-12 are connected between the output of the SW circuit 112-10 and the input of the SW circuit 112-11, and the byte address decoder 112-13 selects the output from the register 112-12.

The byte address decoder 112-13 has its input connected to the byte address BYTEADD input from the P.R. control 110, and selects, by its output, the register 112-12.

In the above-described arrangement, each of the SW circuits 112-10 and 112-11 has a function of deciding the data direction, and in read, connects the output PRD0[i] to IBUS[i] to transfer data to the register 112-12. In data write or erase, the unit circuit 112-1 transfers data to each bank. This control is done by the signals Write and Read (not shown). When inputting write data, to connect the input data from the bus MDIO[i] to the registers 112-12, the signal WriteIn is activated to connect the bus MDIO[i] to the IBUS[i]. At the time of data output, on the other hand, the signal ReadOut is activated to connect the IBUS[i] to the bus MDIO[i]. Normally, the plurality of registers 112-12 are connected, and the selection is controlled by the byte address BYTEADD.

The signal FLAG output from one of the units shown in FIG. 8 is output from the register 112-12. The unit circuit is configured to directly output the read result without intervening the bus MDIO. However, the result may be output via the bus MDIO, as a matter of course.

1-10. Address Mapping

Figure 10A:
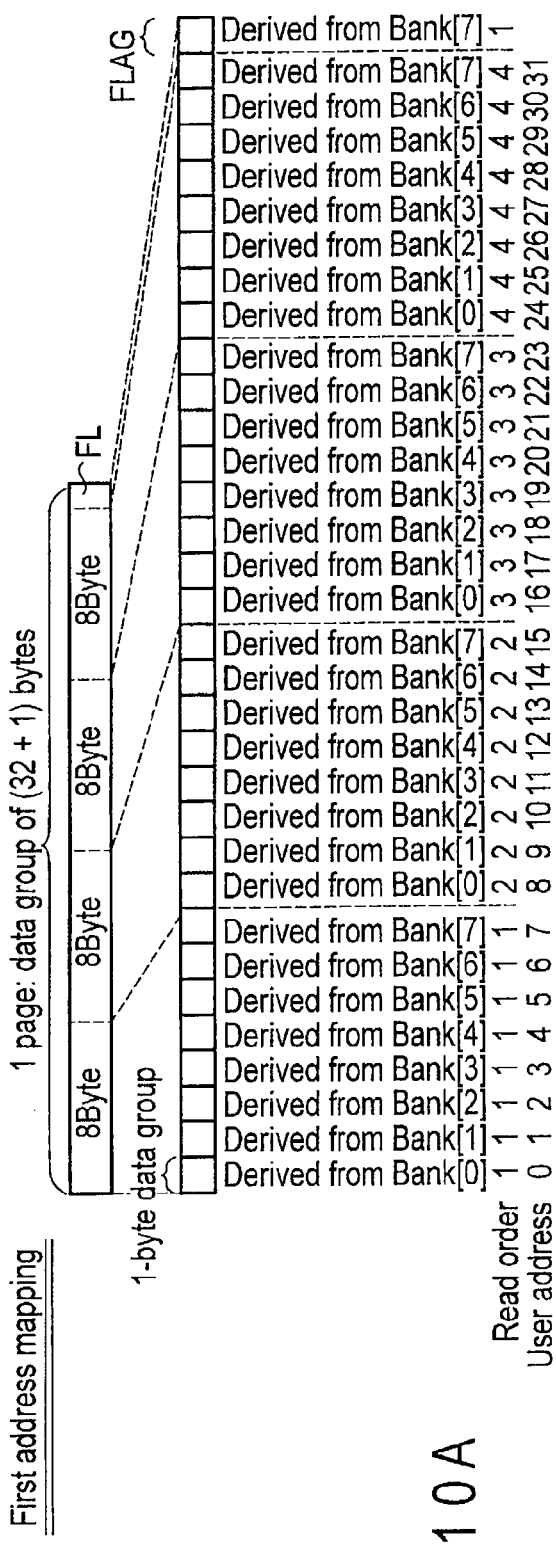
FIG. 10A is a view showing first address mapping according to the first embodiment.
Figure 10B:
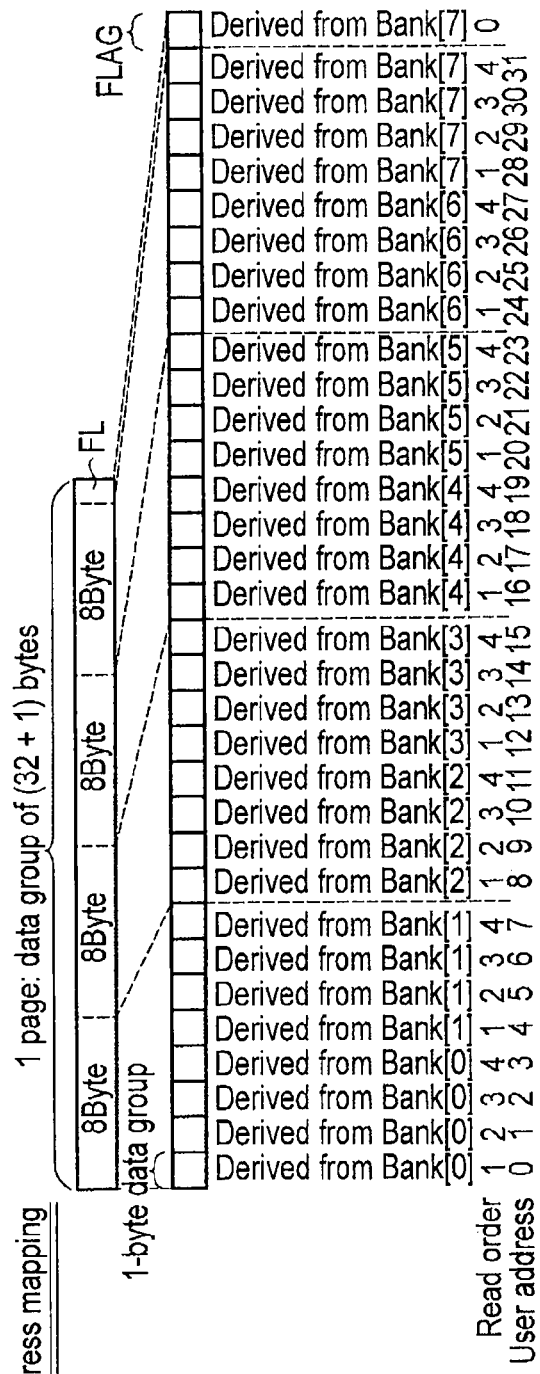
FIG. 10B is a view showing second address mapping according to the first embodiment.
Figure 12:
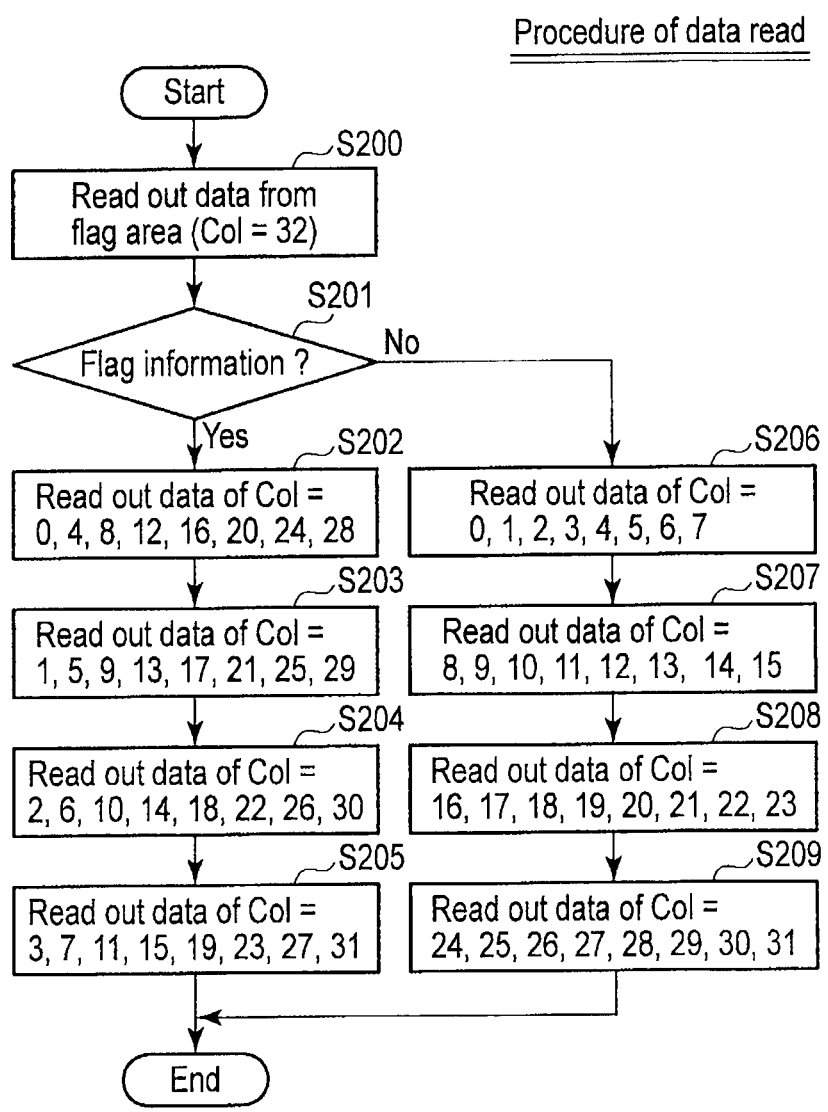
FIG. 12 is a flowchart illustrating the data read operation of the semiconductor memory device according to the first embodiment.

Read data address mapping according to this embodiment will be described next with reference to FIGS. 10A and 10B. In this embodiment, the data structure of one page (1 page: (32+1) bytes) having a redundancy area will be exemplified, as shown in FIGS. 10A and 10B. One-byte flag information (to be referred to as FLAG) is stored in the redundancy area.

In the semiconductor memory device that normally stores a resistance value as data, as in this embodiment, the plurality of banks Bank[0] to Bank[15] are simultaneously activated, and data are uniformly acquired from the banks so as to avoid heat generation and potential drop caused by the current. In most forms, data are read out a plurality of times from different addresses of a single bank to acquire page data. Hence, in this embodiment, a total of eight banks Bank[0] to Bank[7] are simultaneously activated, and 8-bank read is performed four times to ensure 32-byte data of one page.

During the data reading operation, the device is externally given a read command, and the sequence control 107 sends a busy signal to the outside of the device, although not illustrated. More specifically, the ready/busy pin RBx outputs "L" to externally notify that the device is operating.

FIG. 10A shows first address mapping (when the number of failed bits is in the allowable range, that is, the number of failed bits is equal to or smaller than the allowable maximum number, and the flag information FLAG is not detected). As shown in FIG. 10A, in the first address mapping, 8-byte data out of the 32-byte data are simultaneously read out from Bank[0] to Bank[7] at time 1 (read order 1) and stored in addresses 0 to 7 of the registers 112-12 (the unit of the continuous 8-byte data shown in FIG. 10A will be referred to as a "frame" hereinafter). Similarly, at time 2 (read order 2), 8-byte data are simultaneously read out from Bank[0] to Bank[7] at addresses different from those at time 1, and stored in addresses 8 to 15 of the registers 112-12. At time 3 (read order 3) as well, data are simultaneously read out from Bank[0] to Bank[7] at addresses different from those at times 1 and 2, and stored in addresses 16 to 23 of the registers 112-12. At time 4 (read order 4), data are read out from Bank[0] to Bank[7] at addresses different from those at times 1 to 3, and stored in addresses 24 to 31 of the registers 112-12. At time 4 (read order 4), all data of one page are acquired. When the data acquisition is complete, the sequence control 107 (not shown) sends a ready signal to the outside to notify that the device is set in the data output enable state.

FIG. 10B shows second address mapping (when the number of failed bits exceeds the allowable range, that is, the number of failed bits is larger than the allowable maximum number, therefore the flag information FLAG is detected). As shown in FIG. 10B, this embodiment is configured to read out data in an address order mapped by the second address mapping that is different from the first address mapping. In the second address mapping, data derived from Bank[0] in this embodiment) are exclusively mapped to the first 4-bytes. If failed data occur exclusively in Bank[0], they are exclusively mapped to the first frame to relieve the remaining second to fourth frames. The mapping manner is not limited to that of this embodiment, as a matter of course, and is selectable as needed.

In the second address mapping, at time 1 (read order 1), data are simultaneously read out from Bank[0] to Bank[7] and stored in addresses 0, 4, 8, 12, 16, 20, 24, and 28 of the registers 112-12. Similarly, at time 2 (read order 2), the data are stored in addresses 1, 5, 9, 13, 17, 21, 25, and 29 of the registers 112-12. At time 3 (read order 3), the data are stored in addresses 2, 6, 10, 14, 18, 22, 26, and 30 of the registers 112-12. At time 4 (read order 4), the data are stored in addresses 3, 7, 11, 15, 19, 23, 27, and 31 of the registers 112-12. When the read data acquisition is complete, the sequence control 107 sends a ready signal to the outside to notify that the device is set in the data output enable state, as in the first address mapping.

Whether to adopt the first address mapping shown in FIG. 10A or the second address mapping shown in FIG. 10B is determined based on the state of the flag data FLAG read out before the data read operation. In this embodiment, to nonvolatilely hold the flag data FLAG, 1-byte redundancy area is allocated for one page.

For example, when the flag data FLAG indicates the erase state ("0" state), the data read operation is performed by adopting the first address mapping. On the other hand, when the flag data FLAG indicates the write state ("1" state), the data read is performed by adopting the second address mapping. Since the flag byte (FLAG) is a data byte for internal processing, the data is preferably configured to prohibit the user from directly rewriting it from outside of the device.

Details will be described later. However, the order (user address) of reading data to the outside of the device does not change regardless of the first address mapping or the second address mapping.

1-11. Decoding Table

A decoding table according to this embodiment will be described next with reference to FIG. 11.

To implement the first address mapping and the second address mapping, the decoding table of the byte address signal BYTEADD has the arrangement shown in FIG. 11.

This table is implemented by the P.R. control 110 and the array control 108 shown in FIG. 1.

More specifically, the P.R. control 110 and the array control 108 change the cycle address COLAD to be supplied to the memory CORE 100 and change the order of storage in the registers 112-12 of the P.R. 112 based on the state of the signal FLAG output from the P.R. 112.

<2. Data Control Operation>

2-1. Mapped Data Read Operation

The mapped data read operation of the semiconductor memory device according to the first embodiment will be described next with reference to FIGS. 12, 13, 14, 15, and 16. This will be explained in accordance with the procedure shown in FIG. 12.

(Step S0)

Although not illustrated, the control device (memory controller) connected to the semiconductor memory device issues a read address and a read start address before the data read operation and then the semiconductor memory device starts the data read operation.

(Step S200 (Flag Information Read))

First, the sequence control 107 reads out, out of 1-page data, only the flag information FLAG in the redundancy area (Col(BYTEADD)=32) from the memory CORE 100. In this embodiment, the flag information FLAG belongs to Bank[7]. However, a bank may independently be provided. It is only necessary to determine which of the first address mapping and the second address mapping is to be adopted.

(Step S201 (Flag Information Determination))

The sequence control 107 determines the state of the read-out flag information FLAG in the redundancy area (Col(BYTEADD)=32).

For example, upon determining that there is no flag information (FLAG="0" state: erase state) (No), the first address mapping is adopted, and steps S206 to S209 to be described below are executed to acquire the page data.

On the other hand, upon determining that the flag information exists (FLAG="1" state: set state) (Yes), the second address mapping is adopted, and steps S202 to S205 to be described below are executed to acquire the page data.

(Step S202)

Upon determining that the flag information exists (FLAG="1" state: set state) (Yes), the sequence control 107 adopts the second address mapping and simultaneously reads out 8-byte data (Col(BYTEADD)=0, 4, 8, 12, 16, 20, 24, 28) (that is, the data is read out in the read order 1).

(Step S203)

Similarly, the sequence control 107 adopts the second address mapping and simultaneously reads out 8-byte data (Col(BYTEADD)=1, 5, 9, 13, 17, 21, 25, 29) (that is, the data is read out in the read order 2).

(Step S204)

The sequence control 107 simultaneously reads out 8-byte data (Col(BYTEADD)=2, 6, 10, 14, 18, 22, 26, 30) (that is, the data is read out in the read order 3).

(Step S205)

The sequence control 107 simultaneously reads out 8-byte data (Col(BYTEADD)=3, 7, 11, 15, 19, 23, 27, 31) as the fourth frame. The 1-page data is thus read out, and the operation ends (End).

(Step S206)

Upon determining that there is no flag information (FLAG="0" state: erase state) (No), the sequence control 107 adopts the first address mapping and simultaneously reads out 8-byte data (Col(BYTEADD)=0, 1, 2, 3, 4, 5, 6, 7) (that is, the data is read out in the read order 1).

(Step S207)

Similarly, the sequence control 107 adopts the first address mapping and simultaneously reads out 8-byte data (Col(BYTEADD)=8, 9, 10, 11, 12, 13, 14, 15) (that is, the data is read out in the read order 2).

(Step S208)

The sequence control 107 simultaneously reads out 8-byte data (Col(BYTEADD)=16, 17, 18, 19, 20, 21, 22, 23) (that is, the data is read out in the read order 3).

(Step S209)

The sequence control 107 simultaneously reads out 8-byte data (Col(BYTEADD)=24, 25, 26, 27, 28, 29, 30, 31) (that is, the data is read out in the read order 4). The 1-page data is thus read out, and the operation ends (End).

2-2-1. Sequence (This Embodiment)

Figure 13:
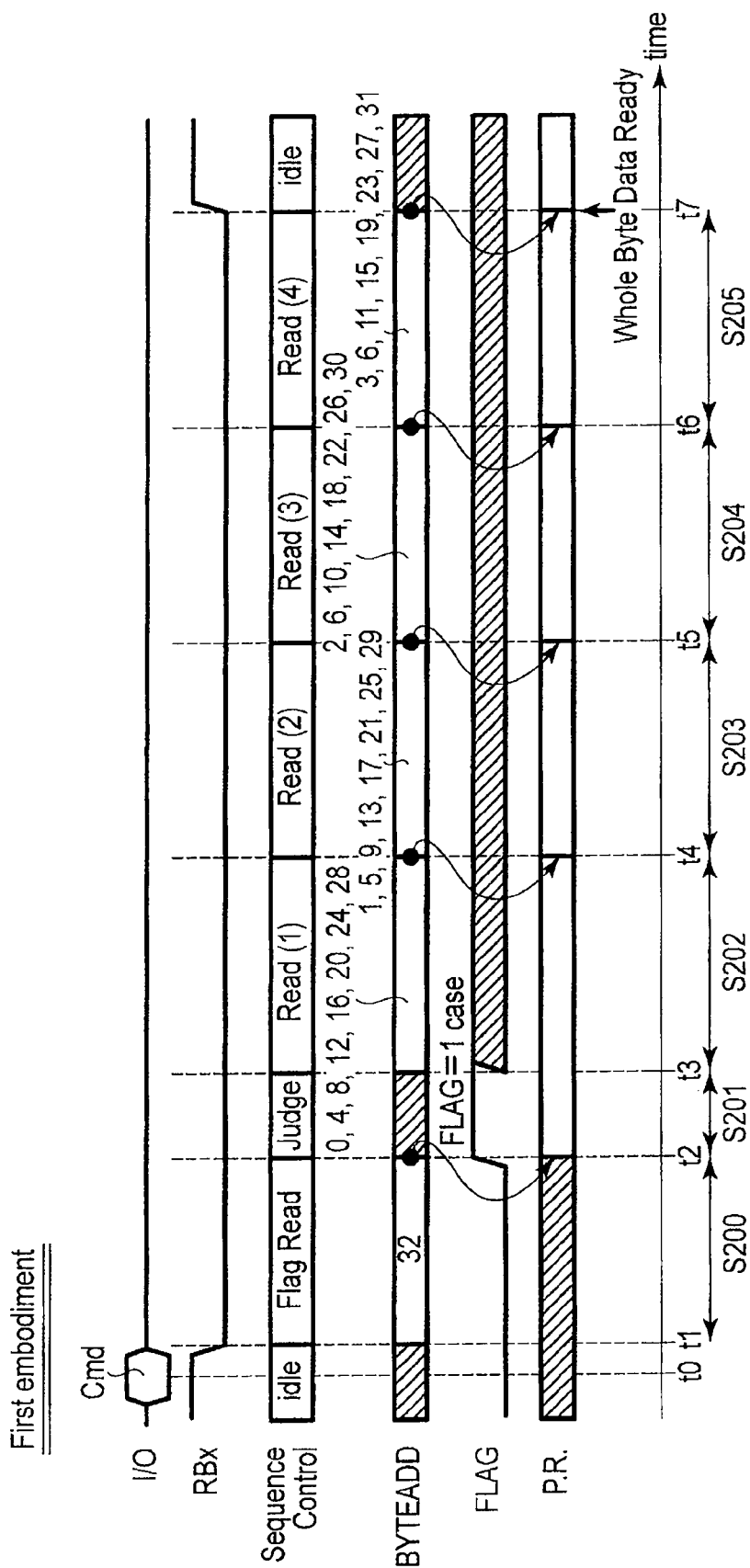
FIG. 13 is a timing chart showing the data read operation of the semiconductor memory device according to the first embodiment.

The sequence of the data read operation of the semiconductor memory device according to the first embodiment will be described next with reference to FIG. 13. FIG. 13 shows the sequence of the data read operation according to the first embodiment.

As shown in FIG. 13, at time t0 when the ready/busy signal RBx is "H", upon receiving a read start command Cmd input from the external memory controller (not shown) via the I/O pin, the sequence control 107 starts the data read operation from the idle state.

At time t1, the semiconductor device changes the ready/busy signal RBx to "L", and the sequence control 107 starts reading the flag information FLAG.

At time t2, the ready/busy signal RBx is "L", and the sequence control 107 judges the presence/absence of the flag information FLAG. In this example, since the flag information FLAG exists (FLAG="1" case), the second address mapping is adopted.

At time t3, the ready/busy signal RBx is "L", and the sequence control 107 starts simultaneously reading out 8-byte data (Col(BYTEADD)=0, 4, 8, 12, 16, 20, 24, 28) (that is, in the read order 1) and storing them in the buffers of the P.R. 112.

At time t4, the ready/busy signal RBx is "L", and the sequence control 107 starts simultaneously reading out 8-byte data (Col(BYTEADD)=1, 5, 9, 13, 17, 21, 25, 29) (that is, in the read order 2) and sequentially storing them in the buffers of the P.R. 112.

At time t5, the ready/busy signal RBx is "L", and the sequence control 107 starts simultaneously reading out 8-byte data (Col(BYTEADD)=2, 6, 10, 14, 18, 22, 26, 30) (that is, in the read order 3) and storing them in the buffers of the P.R. 112.

At time t6, the ready/busy signal RBx is "L", and the sequence control 107 starts simultaneously reading out 8-byte data (Col(BYTEADD)=3, 7, 11, 15, 19, 23, 27, 31) (that is, in the read order 4) and storing them in the buffers of the P.R. 112.

At time t7, when the 1-page data is stored (Whole Byte Data Ready), the semiconductor memory device changes the ready/busy signal RBx to "H", and the sequence control 107 returns to the idle state.

2-2-2. Sequence (Comparative Example)

Figure 14:
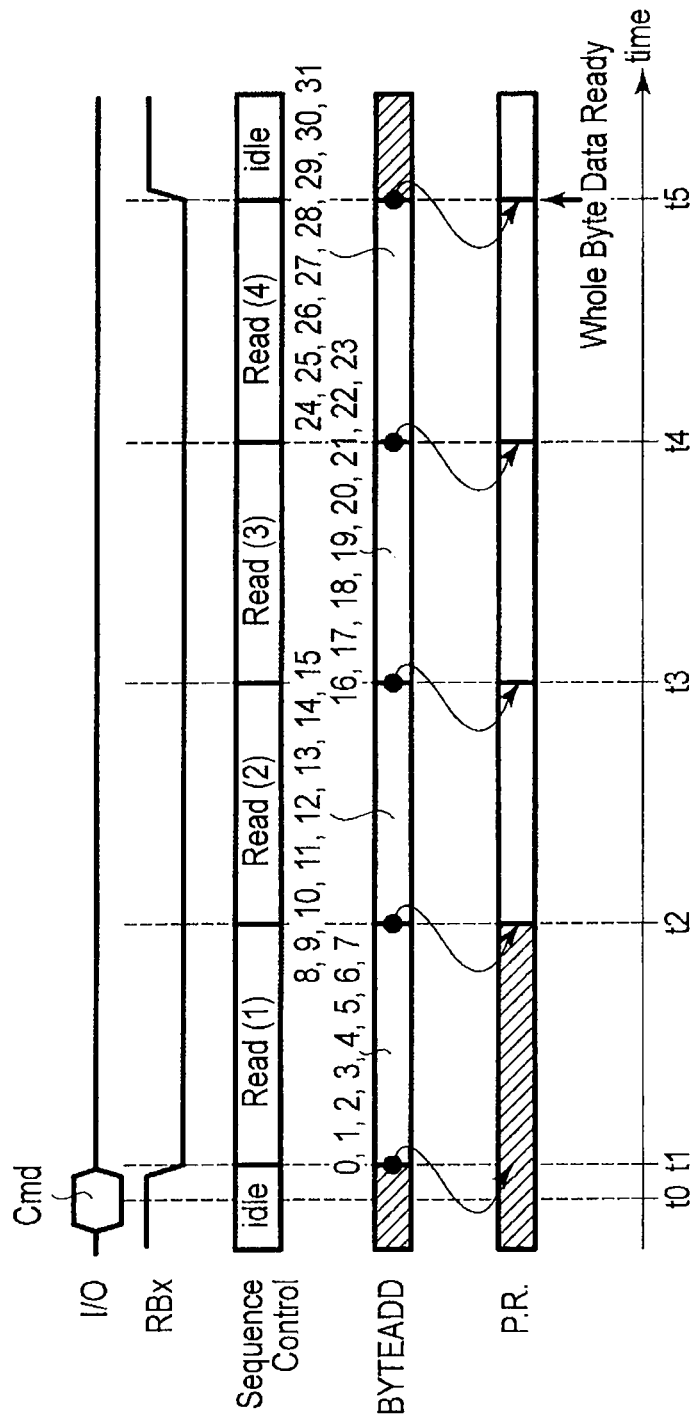
FIG. 14 is a timing chart showing the data read operation of a semiconductor memory device according to a comparative example.

The sequence of the data read operation of a semiconductor memory device according to a comparative example will be described next with reference to FIG. 14. FIG. 14 shows the sequence of the data read operation according to the comparative example to be compared with the first embodiment.

As shown in FIG. 14, the comparative example is different from the first embodiment in that the first address mapping, the second address mapping, and the flag information are not present, and the flag read or the presence/absence of flag information is not judged. Hence, in the comparative example, 8-byte data of the 32-byte data of one page (Col (BYTEADD)=0, 1, 2, . . . , 31) are sequentially simply read out and stored in the registers each time.

<3. Effects>

According to the semiconductor memory device of the first embodiment and the data control method thereof, at least the following effects (1) and (2) can be obtained.

(1) Read Errors can be Prevented

As described above, the semiconductor memory device according to the embodiment has, in the redundancy area of one page (read unit), the flag information FLAG representing whether the number of failed bits is in the allowable range. In the data read operation, the sequence control 107 first reads out data including the flag information FLAG in the redundancy area (Col(BYTEADD)=32) (S200). Next, the sequence control 107 determines the state of the readout flag information FLAG in the redundancy area (Col (BYTEADD)=32) (S201). Upon determining that the flag information exists (FLAG="1" state), the sequence control 107 adopts the second address mapping and executes steps S202 to S205 to be described later to acquire the page data.

In the second address mapping of this embodiment, data derived from Bank[0] in this embodiment) are exclusively mapped to the first 4-bytes. For this reason, if failed data occurred during the manufacturing process or occurred by a failure in long-term use are concentrated in the first bank (Bank[0]), as in this embodiment, the data can be exclusively mapped to the first frame to relieve the remaining second to fourth frames.

Figure 15:
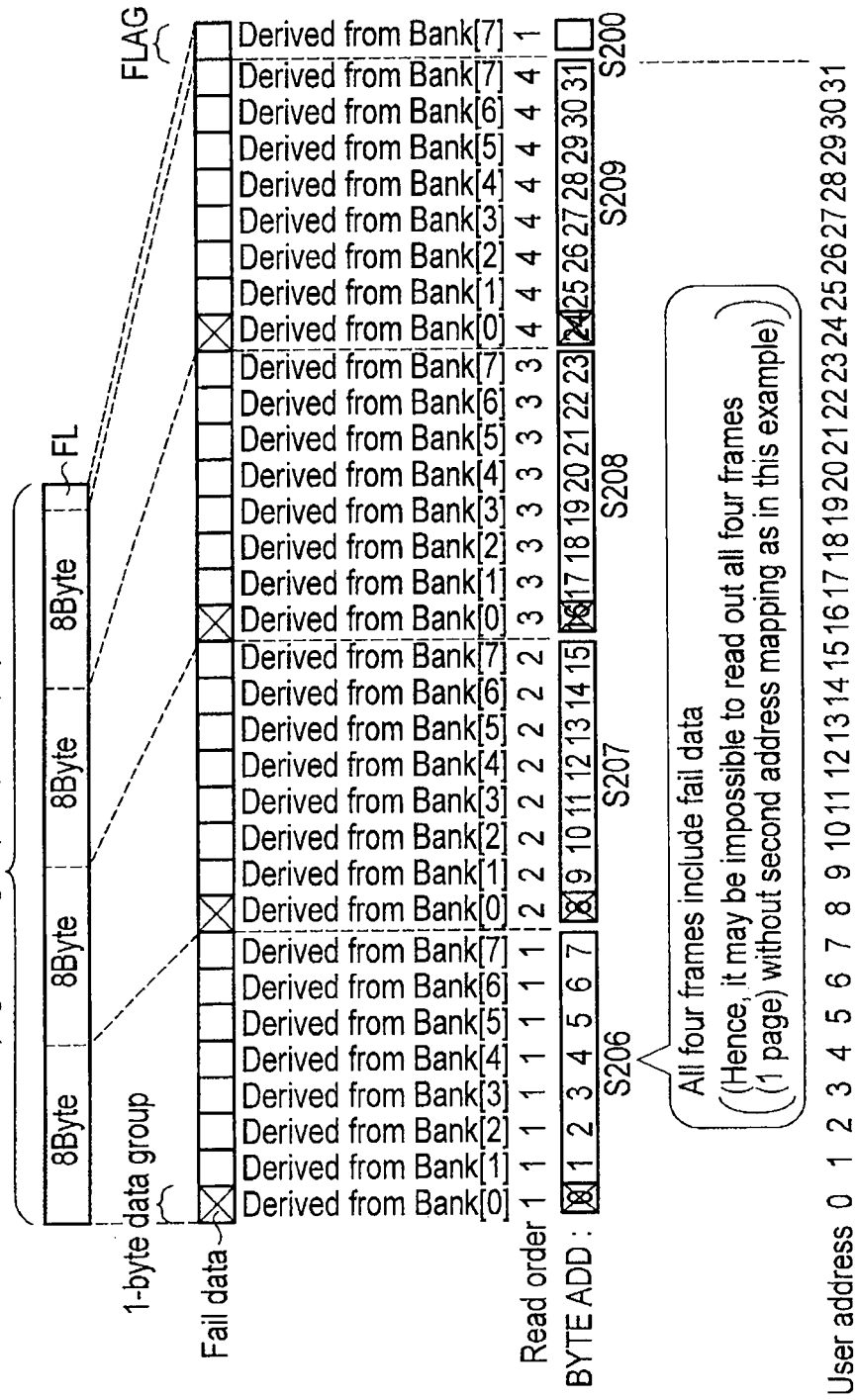
FIG. 15 is a view showing the first address mapping (when Bank[0] contains fails) according to the first embodiment.

More specifically, for example, when failed data occurred in Bank[0] during the manufacturing process or by a failure in long-term use, the read result is represented by the first address mapping as shown in FIG. 15. In this case, failed data (Col(BYTEADD)=0, 8, 16, 24) occurred in Bank[0] exist in the first to fourth frames, as indicated by x in FIG. 15. For this reason, in this address mapping, when the correction unit of ECC is assumed to be 8 bytes, each of the first to fourth frames requires error correction. This may lead to an increase in the load on the error correction circuit and a decrease in the convenience, and make the whole page unreadable (read error).

Figure 16:
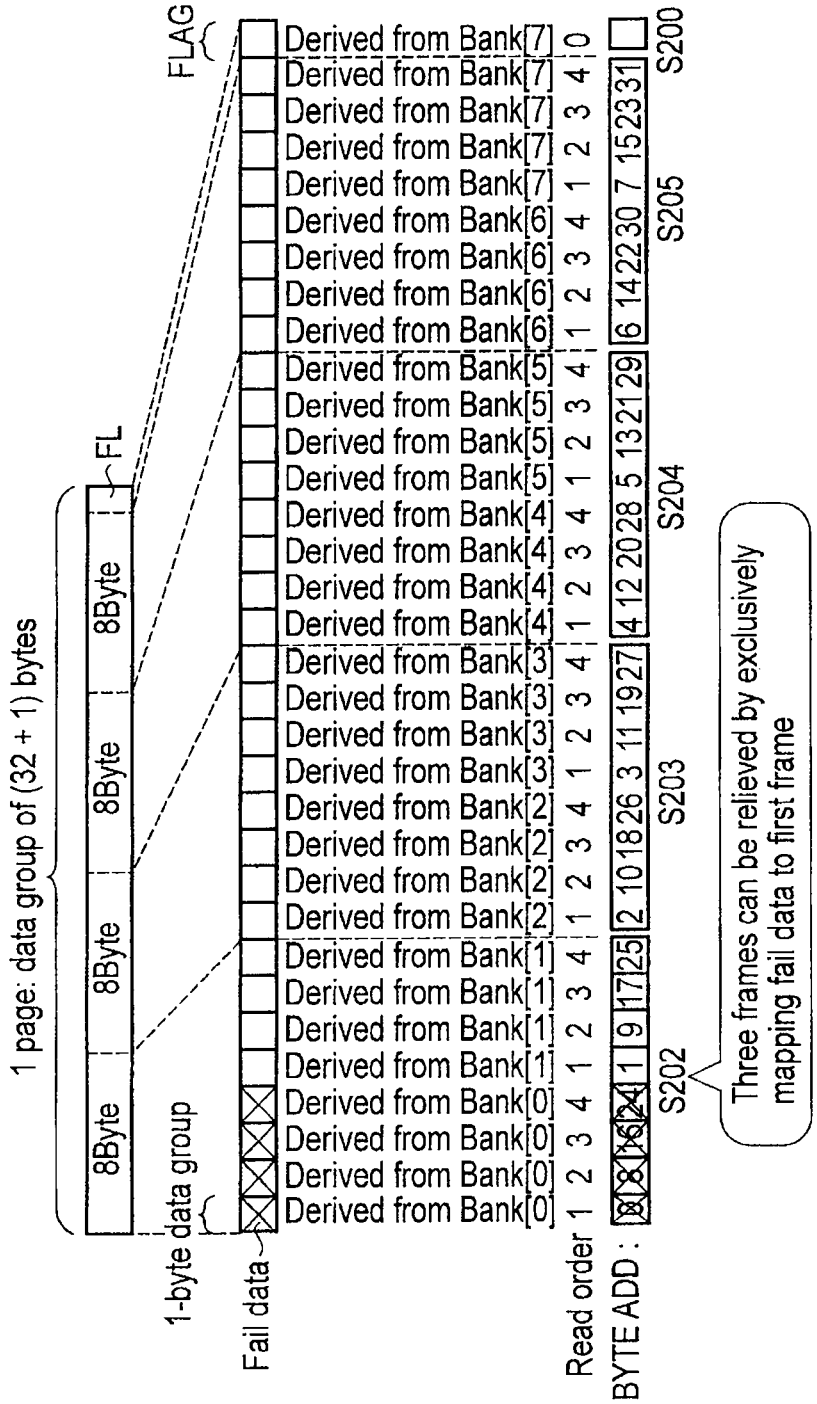
FIG. 16 is a view showing the second address mapping (when Bank[0] contains fails) according to the first embodiment.

When the second address mapping according to this embodiment is adopted, the read result is represented as shown in FIG. 16. As shown in FIG. 16, in the second address mapping, data derived from Bank[0] are exclusively mapped to the first frame (first frame=0, 8, 16, 24, 1, 9, 17, 25). As indicated by x in FIG. 16, the failed data (Col (BYTEADD)=0, 8, 16, 24) can exclusively be mapped to the first frame. This allows to obviate the necessity of error correction in the second to fourth frames and thus reduce the load on the error correction circuit, improve the convenience, and relieve the second to fourth frames. It is also advantageous because not the whole page becomes unreadable (read error).

For example, in the 3D-stacked cross-point nonvolatile semiconductor memory device as in this embodiment, it is useful in that the effect of cross-point failing, typically an erroneous fabrication of diode, is minimized.

(2) Decrease in the Yield can be Prevented

As described above, according to this embodiment, even if any data (in that, any memory cell) is failed during the manufacturing process, the decrease in the yield caused by the failed bit can be prevented. In addition, because an unnecessary operation such as error correction can be omitted, a decrease in performance can be prevented. Furthermore, the arrangement is advantageous in reducing the manufacturing cost because no new complex components need be added, and writing the flag information FLAG in the redundancy area suffices.

Note that a detailed example of setting the flag information FLAG in the redundancy area will be described later (fourth embodiment).

In this embodiment, the data read operation has been described. However, if one page is also defined as the data write unit and the data erase unit, the arrangement is applicable to any other operations such as a data write operation and a data erase operation to obtain the same effects as described above.

Second Embodiment

Example of Notifying External Device of Flag Information

A semiconductor memory device according to the second embodiment and a data control method thereof will be described next with reference to FIGS. 17, 18A, and 18B. This embodiment concerns an example in which a plurality of redundancy areas are provided for a data group that constitutes a page, and a path for notifying an external device of flag information FLAG is prepared. In this description, a detailed description of the same portions as in the first embodiment will be omitted.

In the first embodiment, when at least one bank out of the eight banks of a page to be read-accessed cannot be read due to failed bit, the data read order is changed based on the state of the flag information FLAG in the redundancy area. The flag information FLAG is configured to be usable only for the purpose of internal processing of the semiconductor memory device. For this reason, there is no means that allows the user, more specifically, the control device (memory controller) outside the semiconductor memory device to detect the state of the flag area FLAG. The second embodiment is configured in consideration of this point.

<Example of Arrangement>

Example of Overall Arrangement

An example of the overall arrangement of the semiconductor memory device according to the second embodiment will be described first with reference to FIG. 17.

As shown in FIG. 17, the semiconductor memory device according to this embodiment is different from that of the first embodiment in having a means for electrically connecting the flag information FLAG to an input/output port IOx<7:0> via an output buffer 106-1. Hence, when a command signal (not shown) is input, the device can externally output one of a data bus DOUT[7:0], a status signal STATUS, and the flag information FLAG. This allows to send the state ("1" state or "0" state) of the flag information FLAG to the outside of the device.

Format of Flag Information

The format to store the flag information FLAG according to the second embodiment will be described next with reference to FIGS. 18A and 18B. In the above-described first embodiment, the format of the flag information FLAG has not particularly been defined. The second embodiment is different from the first embodiment in that, for example, the 8 bits of the 1-byte flag information FLAG are further configured to store unique information, as shown in FIG. 18A.

Figure 18A:
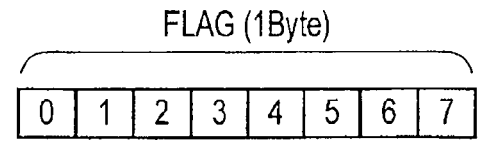
FIG. 18A is a view showing the format of flag information according to the second embodiment.
Figure 18B:
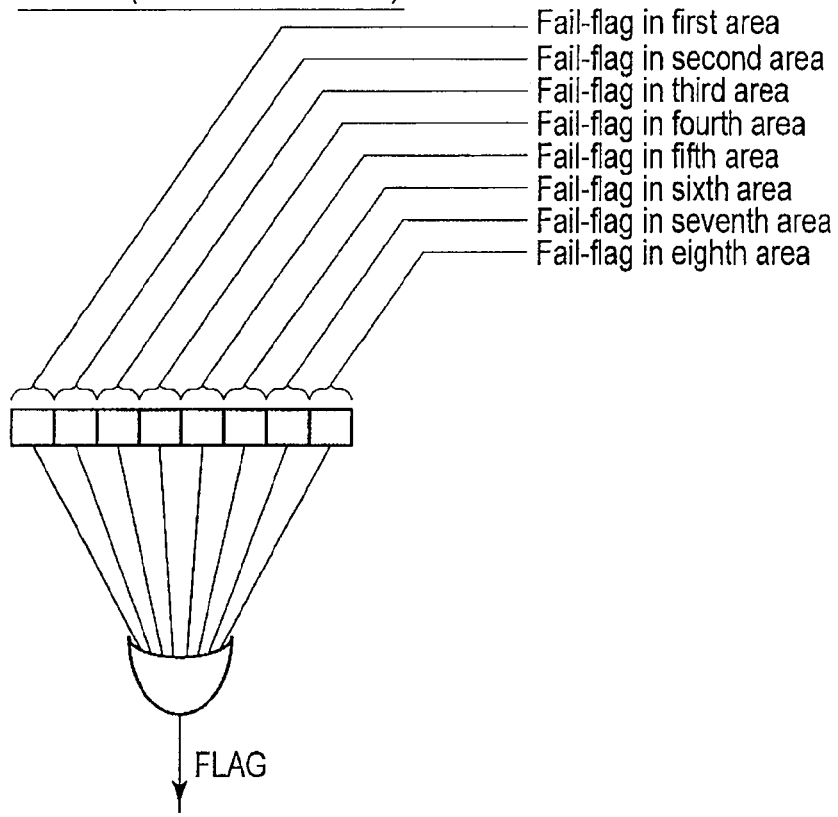
FIG. 18B is a view showing a register for storing the format of flag information according to the second embodiment.

Hence, the flag information FLAG according to this embodiment is stored as eight fail-flags that are discriminatively independently stored in the first to eighth different areas of corresponding registers 112-12 of a P.R. 112, as shown in FIG. 18B.

The fail-flags in the first to eighth areas correspond to the banks in a one-to-one correspondence.

For example, the fail-flag in the first area represents the presence/absence of a failure (failed bit) in Bank[0]. Similarly, the fail-flags in the second to eighth areas represent the presence/absence of a failure in Bank[1] to Bank[7], respectively.

The fail-flag according to the first embodiment is formed from the OR information of the fail-flags in the eight areas. If the fail-flag is set in one area, the operation is performed using the second address mapping. If no fail-flag is set, the operation is performed using the first address mapping.

On the other hand, in the second embodiment, the flag information FLAG of each bank is independently stored. This aims at making the external control device (memory controller) (not shown) to recognize the ECC frame to which failed bit concentrate in advance based on the flag information FLAG so as to output the flag information FLAG to the outside of the device and use the second address mapping. This enables to manage data necessary for data write, data erase, and data read based on the flag information FLAG.

More specifically, it is possible to provide a data management means to, for example, recognize the data read result of a frame which contains many fails as blank data or prohibit valid data input to the frame in write.

As described above, according to this embodiment, it is possible to provide a plurality of redundancy areas for a data group that constitutes a page and thus notify the external device of the flag information FLAG.

<Effects>

According to the semiconductor memory device of the second embodiment and the data control method thereof, at least the same effects as the above-described effects (1) and (2) can be obtained. According to this embodiment, the following effect (3) can also be obtained.

(3) The External Device can be Notified of the Flag Information Flag, and the Convenience can be Improved As shown in FIGS. 18A and 18B, according to the arrangement of this embodiment, providing a plurality of redundancy areas for the data group that constitutes a page allows to notify a device outside the device of the flag information FLAG.

It is advantageous because the user (more specifically, the control device (memory controller)) outside the semiconductor memory device can detect the state of the flag area FLAG, and the convenience can be improved.

Third Embodiment

Example of Further Deciding Read Data Length

A semiconductor memory device according to the third embodiment and a data control method thereof will be described next with reference to FIGS. 19, 20A, 20B, and 20C. This embodiment concerns an example in which a plurality of redundancy areas are provided for a data group that constitutes a page, and the read data length is further decided. In this description, a detailed description of the same portions as in the second embodiment will be omitted.

<Example of Arrangement>

An example of the overall arrangement of the semiconductor memory device according to this embodiment will be described with reference to FIG. 19. In this embodiment that is a modification of the above-described second embodiment, a plurality of redundancy areas are provided for a data group that constitutes a page, and the read data length is further decided.

Figure 19:
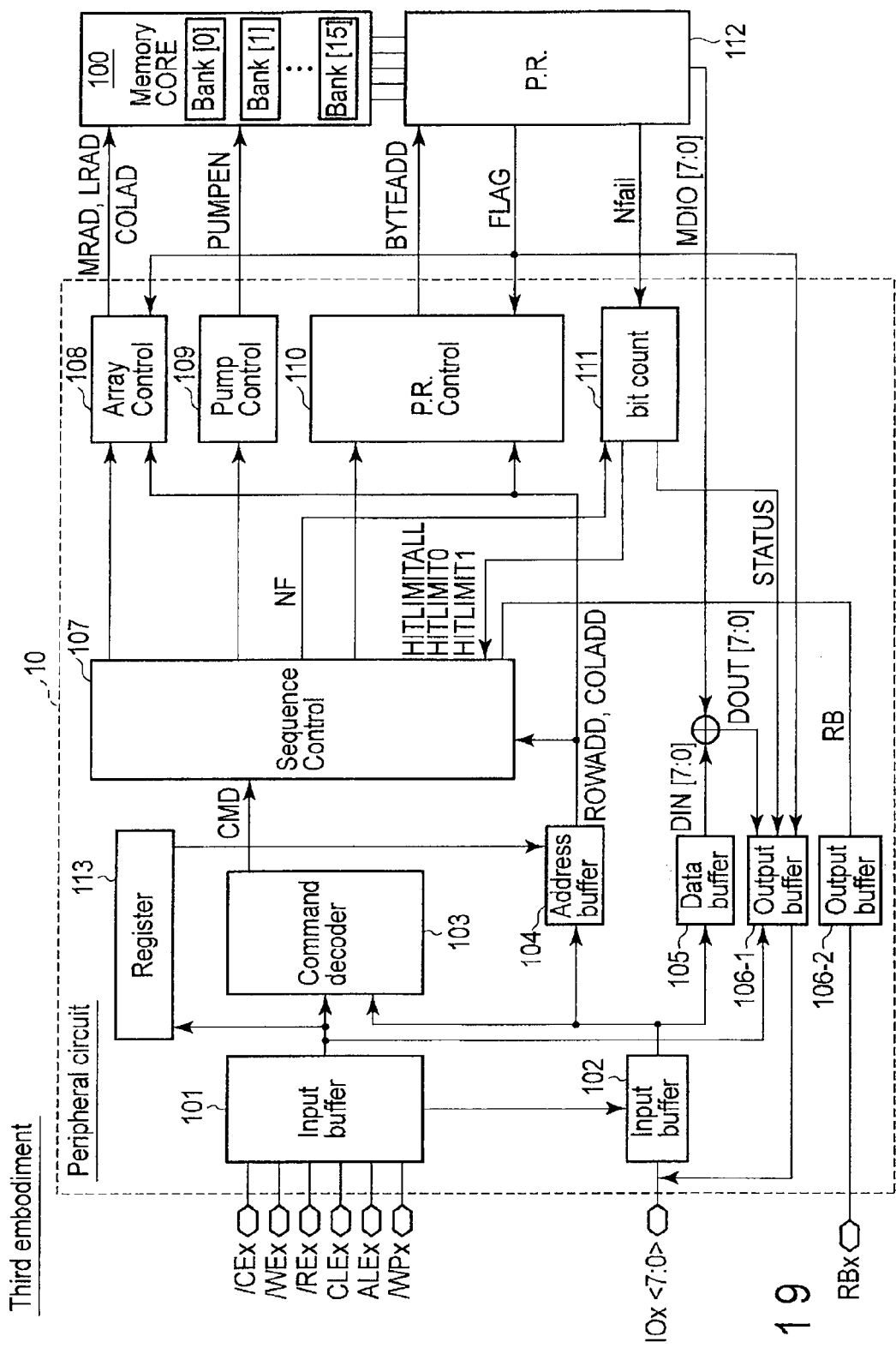
FIG. 19 is a block diagram showing an example of the overall arrangement of a semiconductor memory device according to the third embodiment.

For this reason, this embodiment is different from the second embodiment in further comprising a register circuit (register) 113, as shown in FIG. 19.

The register 113 is formed from a volatile storage circuit capable of rewriting its contents upon receiving a command or data supplied from a memory controller or the like outside the semiconductor memory device. The register 113 has its input connected to the output of an input buffer 101, and its output connected to an address buffer 104.

In this embodiment, since 32-byte data of one page (read unit) is read out in four different cycles, one cycle has 8 bytes. For this reason, assume that the read data length is changed in steps of 8 bytes. In this case, when 2-bit data is stored in the register 113, the read data length can be set based on the state of the stored data.

More specifically, when a 2-bit register is prepared in the register 113, four different states can be set. For example, when the state of data stored in the 2-bit register is "00", data in the maximum data length of 32 bytes is read out. When the data state is "01", 24-byte data is read out. In the "10" state, 16-byte data is read out. In the "11" data state, 8-byte data is read out.

<Data Read Operation>

The data read operation of the semiconductor memory device according to this embodiment will be described next with reference to FIGS. 20A, 20B, and 20C. In this embodiment as well, one page that is the read unit has 32 bytes, the purpose is data processing in the device, data rewrite is possible only in the device, and the plurality of flag areas (redundancy areas) are read-accessible from the outside of the device. Further providing a redundancy area for another object is not precluded.

(a) The start address is set to 0, and the read data length is set to 32 bytes (when no fail data exists).

FIG. 20A shows an example in which the read start address given before the data read operation is set to 0, and 32-byte data is read out up to the final address of the page.

First, before the data read operation, the register provided in the register 113 to decide the read data length is set to 32 bytes in advance to decide the read data length to be designated. For example, in the case (a), since no failed bit exists in the one page, the data length need not be changed. Hence, the external memory controller or the like reads out the data up to the final address of the one page by executing the first to fourth cycles in steps of 8 bytes.

After the flag cycle is executed, the operations of the first cycle, the second cycle, . . . are executed. Hence, in the first cycle, the first frame is read out, as in the above-described embodiment.

Similarly, in the second to fourth cycles, the second to fourth frames are sequentially read out.

(b) The start address is set to 0, and the read data length is set to 16 bytes (fail bits concentrate to the third and fourth cycles).

In the example shown in FIG. 20B, the failed bits concentrate to the third and fourth cycles. Hence, the register set in the register 113 is restricted to 16 bytes in advance before the data read operation.

Similarly, flag information FLAG bit is read out first as the flag cycle.

In the first and second cycles, the first and second frames are read out, as in the above-described embodiment. On the other hand, in the subsequent third and fourth cycles, data read is not performed but omitted because the read data is limited to 16 bytes.

(c) The start address is set to 8, and the read data length is set to 8 bytes (failed bits are concentratively included in the first, third, and fourth cycles).

In the example shown in FIG. 20C, failed bits are concentratively included in the first, third, and fourth cycles. Hence, the start address is set to 8, and the register set in the register 113 is restricted to 8 bytes in advance.

Similarly, the flag information FLAG bit is read out first as the flag cycle.

Next, in the first cycle, data read is not performed but omitted because the start address is 8.

In the second cycle, the second frame is read out, as in the above-described embodiment.

In the subsequent third and fourth cycles, data read is not performed but omitted because the read data is limited to 8 bytes.

<Effects>

According to the semiconductor memory device of the third embodiment and the data control method thereof, at least the same effects as the above-described effects (1) to (3) can be obtained. In this embodiment, the following effect (4) can also be obtained.

(4) Only Data in the Data Length Required by the External Control Device can be Acquired, and the Read Time can be Shortened This embodiment is different from the second embodiment in further comprising the register 113.

It is advantageous because the read start address and the read data length can be set in advance based on the state of 2-bit data set in the register 113, and only data in the data length required by the control device (memory controller) (not shown) outside the device can be acquired.

In addition, it is advantageous in shortening the read time because frame data that is unusable due to so-called crosspoint failures caused by a defect that has occurred during the manufacturing process or memory cell degradation in long-term use need not be read out wastefully, and reading out only the data portion actually necessary for the external control device suffices.

More specifically, as shown in FIG. 20B, for example, if failed bits are concentratively included in the portion including addresses 16 to 31 in advance using the second address mapping, the control device (not shown) sets the read data length to 16 bytes before read. That is, the state of the 2-bit data register stored in the register 113 is set to "10", and the read start address is set to 0. The data read operation is then performed.

In FIG. 20B, the first and second frames are sequentially read out in the first and second cycles, as in the above-described embodiment. In the subsequent third and fourth cycles, however, data read is not performed because the read data is limited to 16 bytes.

Hence, in this embodiment, it is unnecessary to read out all areas of one page (32 bytes), and only the necessary first and second frames can be read out, in addition to allowing the external control device to detect the flag information FLAG, as in the second embodiment.

In other words, when the data read in the second cycle has ended, necessary data has already been acquired in a register 112-12 without executing the third and fourth cycles. For this reason, the semiconductor memory device can end the data read operation and notify the external device of the ready state by a ready/busy signal RBx at that point of time.

As described above, since the cycles unnecessary for the external memory controller or the like can be omitted, the arrangement is effective in shortening the data read time.

Fourth Embodiment

Example of Preparing Flag Information

Figure 21:
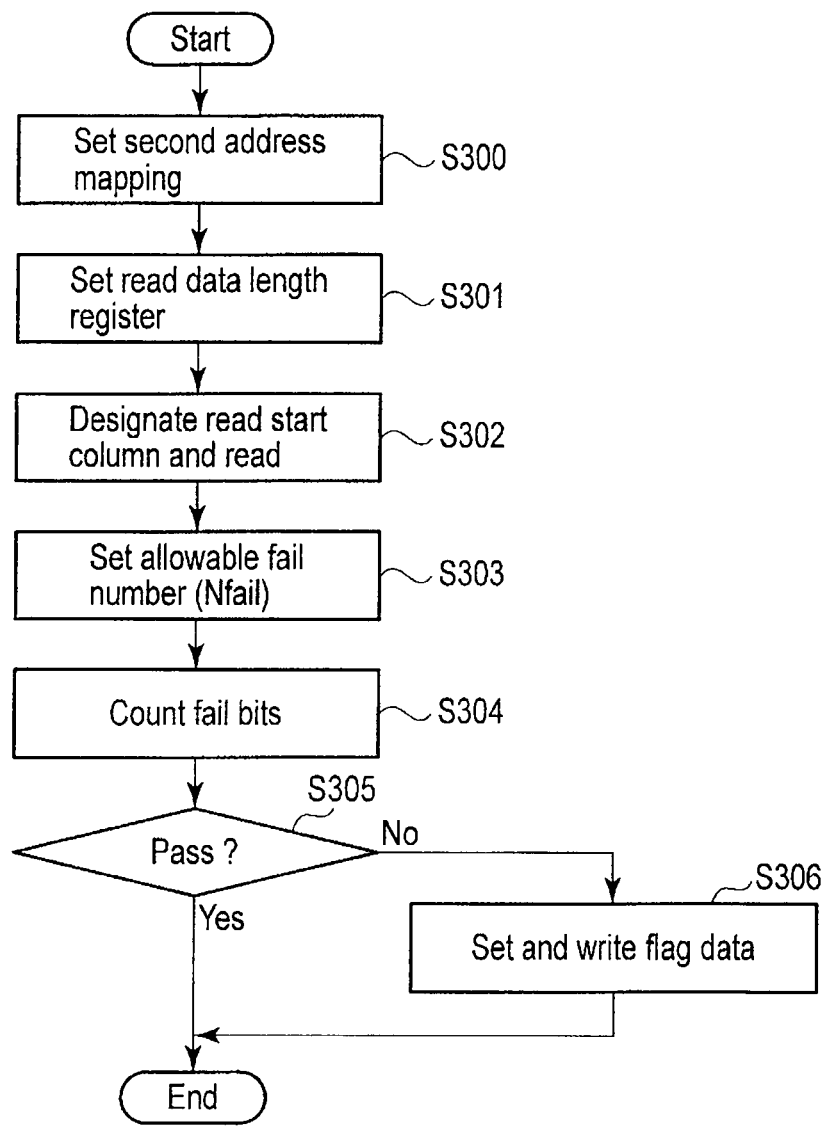
FIG. 21 is a flowchart illustrating flag information preparation according to the fourth embodiment.

A semiconductor memory device according to the fourth embodiment and a data control method thereof will be described next with reference to FIG. 21. This embodiment concerns an example in which flag information FLAG described above is prepared. In this description, a detailed description of the same portions as in the first to third embodiments will be omitted.

When executing the first to third embodiments, the flag information FLAG needs to be prepared and stored in the redundancy area in advance. "In advance" means, for example, the timing of shipment from the factory if the defects have occurred during the manufacturing process, or an arbitrary timing by a control device (not shown) connected to the semiconductor memory device if the cause is a fail that has occurred due to degradation in long-term use.

<Example of Arrangement>

For example, if the defects have occurred during the manufacturing process, and the flag information FLAG is set at the timing of shipment from the factory, as described above, the arrangement is the same as that of the above-described first or second embodiment.

This arrangement makes it possible to select whether to use the first address mapping or the second address mapping temporarily from the outside of the device.

The remaining components are almost the same as in the first to third embodiments, and a detailed description thereof will be omitted.

<Write of Flag Information FLAG>

A procedure of preparing the flag information FLAG will be described next with reference to FIG. 21.

(Step S300)

To temporarily switch the address mapping by an external memory controller or the like, the value of a register 112-12 in a P.R. 112 is changed. In this case, for example, the register 112-12 is set to select the second address mapping.

(Step S301)

The external memory controller or the like sets the state of data stored in a register 113 according to the above-described third embodiment to change the read data length. In this case, since 1-bank data is packed to 4 consecutive bytes, the length is set to at least four bytes. In this embodiment, the data length is set to 8 bytes, as in the above-described embodiment.

(Step S302)

The read start column address is designated, and the same data read operation as described above is started. The read data that is the result of this step is held on the register 112-12.

(Step S303)

The allowable number of failed bits (Nfail) is set in the P.R. 112. The allowable number of failed bits (Nfail) is variable. At the shipment timing, the allowable number (Nfail) may be set using a failed bit counter 112-9 as needed. At the above-described arbitrary timing, the externally connected control device (not shown) may set the allowable number (Nfail).

More specifically, since 4-byte data is read out from a single bank in this embodiment, 4-byte data may be output at maximum as data caused by a single cross-point fail and having a value different from the expected value. Hence, when the allowable number of failed bit (Nfail) is set to 3, data including failed bits over 4, which do not match the expected value, can be estimated as the failed data.
(Step S304)

Next, based on the read result held on the register 112-12, the number of failed bits over the allowable failed bit number, which is different from the expected value, is counted in the device.

The failed bits can be either counted using the failed bit counter 112-9 and a fail number compare 111 in the device, or read out to the externally connected control device and counted.
(Step S305)

The allowable fail number (Nfail) preset in step S303 is compared with the failed bit number counted in step S304 using the failed bit counter 112-9 and the fail number compare 111 to determine whether the failed bit number is in the range of the allowable failed bit number.

At this time, more specifically, it is also possible to determine whether the number of failed bits is in the allowable range not only by determining the match/mismatch of a single expected value but also by comprehensively determining the match/mismatch of a plurality of expected values.

Upon determining in step S305 that the failed bit number is in the range of the allowable number of failed bits (Nfail) (Yes), the possibility of the above-described cross-point failure is low. In this case, the first address mapping suffices, and the second address mapping need not be used. For this reason, the flag information FLAG need not be written ("0" state: erase state), and the operation ends (End).
(Step S306)

Upon determining in step S305 that the failed bit number exceeds the range of the allowable number of failed bits (Nfail) (No), the possibility of the cross-point failure is high (comprehensive determination may be done based on the necessary fail pattern and the like). Hence, the flag information FLAG is written and set in the redundancy area ("1" state: set state).

The flag information FLAG is written in a portion (redundancy area) different from the area of normal memory cell data. In addition, when the flag data FLAG is changed, the information is lost. For this reason, the flag information FLAG is arranged in the area where flag overwrite operation is allowed but rewrite or erase operation is prohibited during normal data erase or rewrite. The flag information FLAG is more preferably set using a method different from that of normal data write, for example, by separately providing a command sequence so as to prevent a write error.
<Effects>

According to the semiconductor memory device of the fourth embodiment and the data control method thereof, at least the same effects as the above-described effects (1) to (4) can be obtained.

In addition, according to this embodiment, the above-described flag information FLAG can be set. This makes it possible to minimize the influence of troubles caused by fails and contribute to improvement of the convenience of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells and having a plurality of data units, each of the data units being read out collectively;
a first register configured to store data of the memory cells for each of the data units; and
a sequence control circuit configured to control the memory cell array and the first register,
wherein in at least a data read operation of the memory cells, the sequence control circuit
reads out, from the memory cell array, data including flag information representing whether the number of failed bits is in an allowable range,
determines whether the number of failed bits is in the allowable range based on a state of the readout flag information,
when it is determined that the number of failed bits is in the allowable range based on the state of the readout flag information, reads out the data of the memory cell using first address mapping for mapping the data to read out the data in an order of addresses stored in the first register, and
when it is determined that the number of failed bits is not in the allowable range based on the state of the readout flag information, reads out the data of the memory cell using second address mapping whose read order is different from that of first address mapping.

2. The device of claim 1, wherein upon determining that the flag information does not exist, the sequence control circuit further controls to read out the data of the memory cell using the first address mapping for mapping the data to read out the data in the order of addresses stored in the first register.

3. The device of claim 1, wherein in the first address mapping, data derived from a first bank exists in each of a plurality of frames each serving as a data read unit from the memory cell array.

4. The device of claim 1, wherein in the second address mapping, data derived from a first bank is exclusively mapped to a first frame serving as a data read unit from the memory cell array.

5. The device of claim 1, further comprising:
a path configured to notify an external device of the flag information; and
a second register configured to store at least 1-bit data to decide the number of access addresses and a data length of the memory cell array.

6. The device of claim 1, wherein the flag information is set in a redundancy area of a read unit where an overwriting is allowed, but data rewrite and data erase are prohibited.

7. The device of claim 1, wherein the plurality of memory cells are arranged at intersections between a plurality of word lines and a plurality of bit lines and three-dimensionally stacked in a plurality of layers on a semiconductor substrate, each of the plurality of memory cells including a variable resistive element configured to store an electrically rewritable resistance value as data.

8. The device of claim 1, further comprising a fail bit number comparison circuit configured to, in data write to the memory cell array, count the number of fail bits existing in the memory cell array, compare the number of fail bits with an allowable fail bit number, and notify the sequence control circuit of a comparison result.

9. The device of claim 8, wherein the fail bit number comparison circuit externally outputs the comparison result from the semiconductor memory device.

10. The device of claim 1, further comprising:
   an output buffer configured to latch the data from the first register; and
   a pad receiving the data from the output buffer,
   wherein the flag information is transferred from the memory cell array to the first register.

11. The device of claim 1, wherein:
   a size of the flag information is smaller than a size of the data unit.

12. A control method of a semiconductor memory device including a memory cell array, in at least data read of the memory cells, the control method comprising:
   reading out, from the memory cell array, data including flag information representing whether the number of failed bits is in an allowable range;
   determining whether the number of failed bits is in the allowable range based on a state of the readout flag information;
   when it is determined that the number of failed bits is in the allowable range based on the state of the readout flag information, reading out the data of the memory cell using first address mapping for mapping the data to read out the data in an order of addresses stored in the first register: and
   when it is determined that the number of failed bits is not in the allowable range based on the state of the readout flag information reading out the data of the memory cell using second address mapping whose read order is different from that of said first address mapping.

13. The method of claim 12, further comprising, upon determining that the flag information does not exist, reading out the data of the memory cell using the first address mapping for mapping the data to read out the data in the order of addresses stored in the first register.

14. The method of claim 12, wherein in the first address mapping, data derived from a first bank exists in each of a plurality of frames each serving as a data read unit from the memory cell array.

15. The method of claim 12, wherein in the second address mapping, data derived from a first bank is exclusively mapped to a first frame serving as a data read unit from the memory cell array.

16. The method of claim 12, wherein the flag information is set in a redundancy area of a read unit where an overwriting is allowed, but data rewrite and data erase are prohibited.

17. The method of claim 12, wherein the memory cell array includes a plurality of memory cells, and the plurality of memory cells are arranged at intersections between a plurality of word lines and a plurality of bit lines and three-dimensionally stacked in a plurality of layers on a semiconductor substrate, each of the plurality of memory cells including a variable resistive element configured to store an electrically rewritable resistance value as data.

* * * * *